(12) United States Patent
Hosotani et al.

(10) Patent No.: US 8,111,538 B2
(45) Date of Patent: Feb. 7, 2012

(54) SEMICONDUCTOR MEMORY DEVICE

(75) Inventors: Keiji Hosotani, Sagamihara (JP);
Yoshiaki Asao, Sagamihara (JP);
Yoshihisa Iwata, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 427 days.

(21) Appl. No.: 12/273,874

(22) Filed: Nov. 19, 2008

(65) Prior Publication Data
US 2009/0129141 A1 May 21, 2009

(30) Foreign Application Priority Data

Nov. 21, 2007 (JP) ................................. 2007-302134

(51) Int. Cl.
*G11C 11/00* (2006.01)
(52) U.S. Cl. ....................................... 365/148; 365/158
(58) Field of Classification Search .................. 365/148, 365/158
See application file for complete search history.

(56) References Cited

U.S. PATENT DOCUMENTS

| 6,778,426 B2 | 8/2004 | Hosotani |
| 6,795,334 B2 | 9/2004 | Iwata et al. |
| 2007/0279970 A1* | 12/2007 | Katti ............................ 365/158 |
| 2008/0151608 A1 | 6/2008 | Hosotani et al. |

FOREIGN PATENT DOCUMENTS

JP  2002-343078  11/2002

OTHER PUBLICATIONS

M. Hosomi, et al., "A Nonvolatile Memory with Spin Torque Transfer Magnetization Switching: Spin-RAM", Proc. of IEDM 2005, Dec. 2005, 4 pages.

* cited by examiner

*Primary Examiner* — Hoai V Ho
*Assistant Examiner* — Anthan T Tran
(74) *Attorney, Agent, or Firm* — Oblon, Spivak, McClelland, Maier & Neustadt, L.L.P.

(57) ABSTRACT

A semiconductor memory device includes a memory cell array having a plurality of memory cells which are set into low-resistance states/high-resistance states according to "0" data/"1" data. An allocation of the "0" data/"1" data and the low-resistance state/high-resistance state is switched when a power source is turned on.

6 Claims, 14 Drawing Sheets

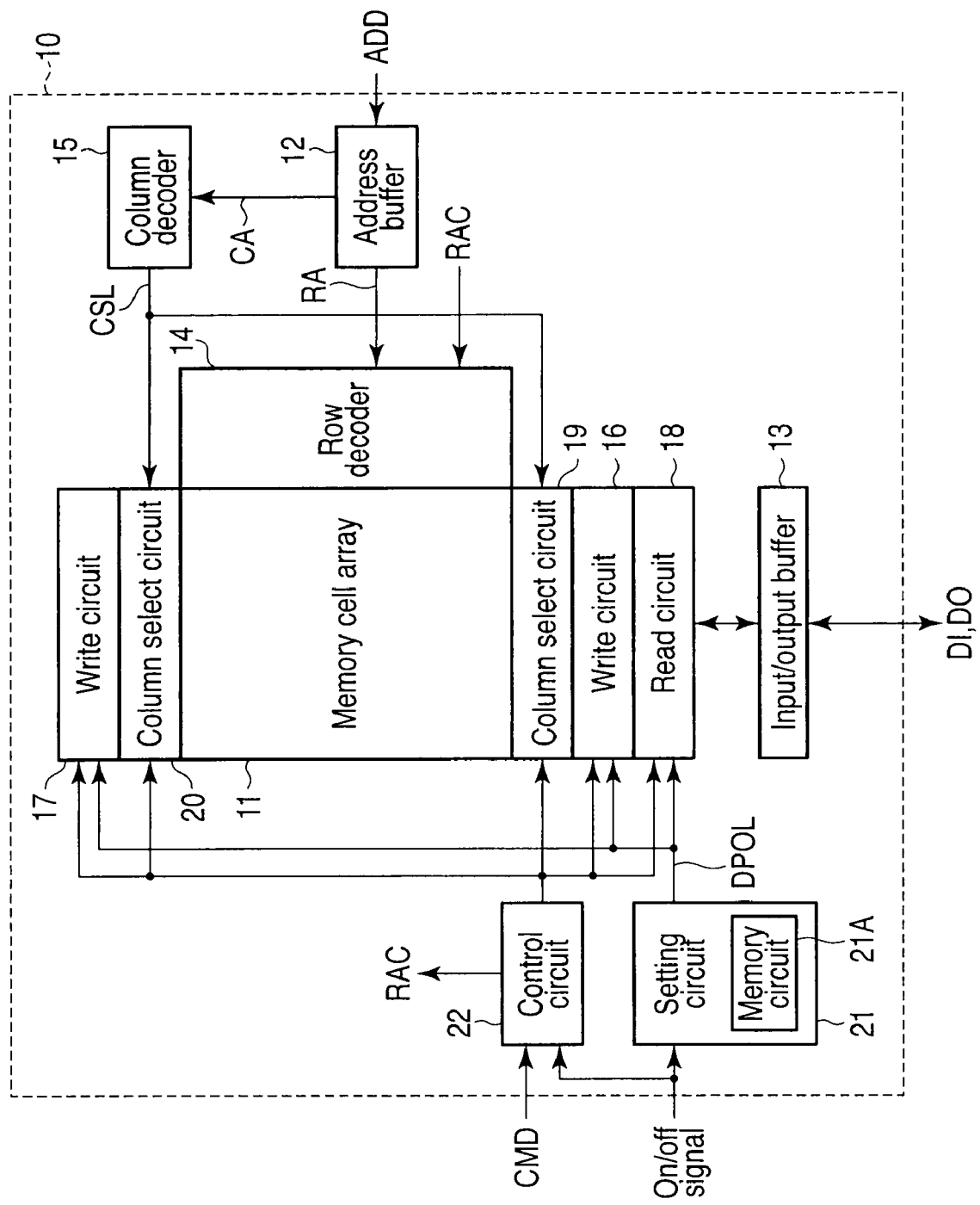
F I G. 1

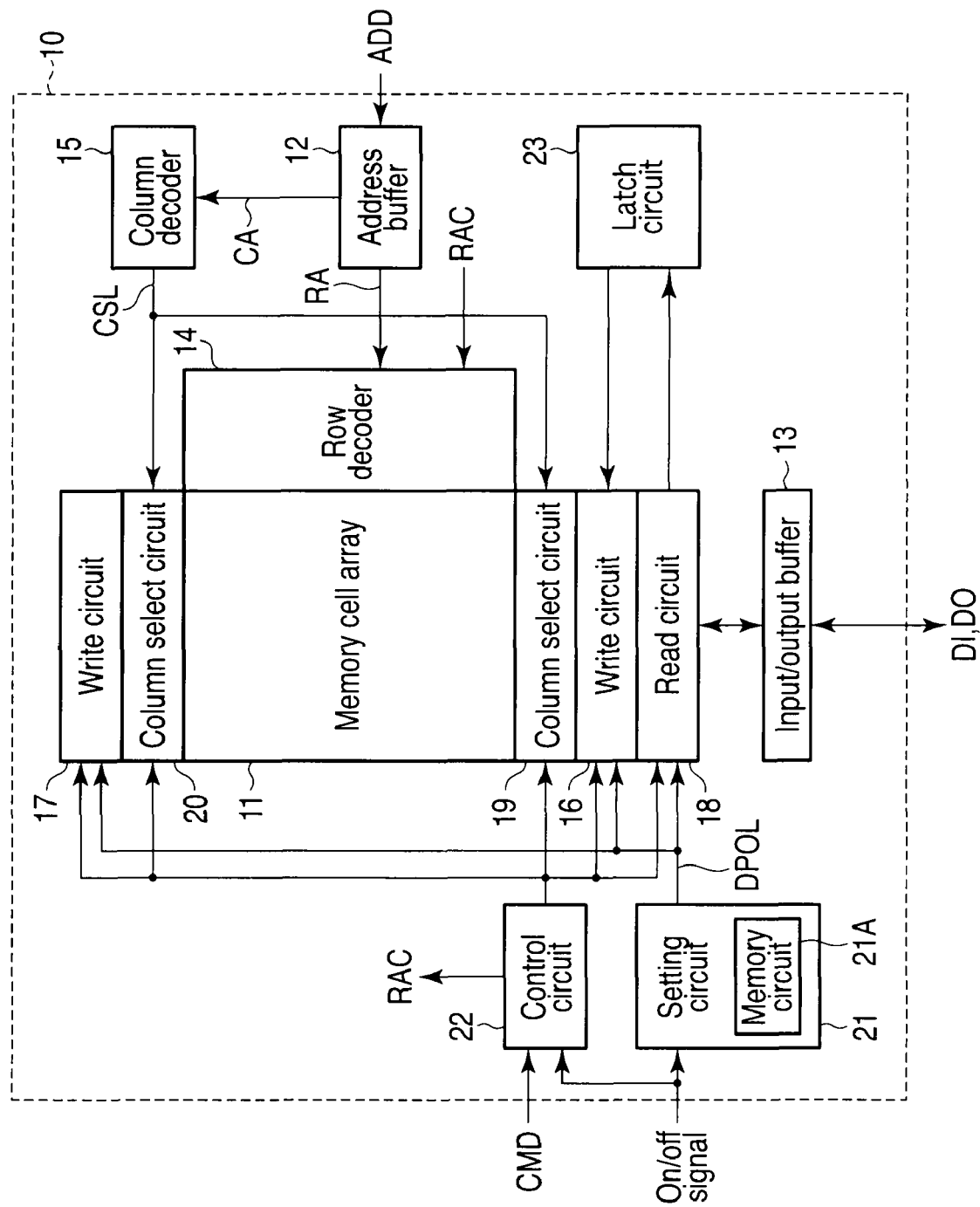
F I G. 5

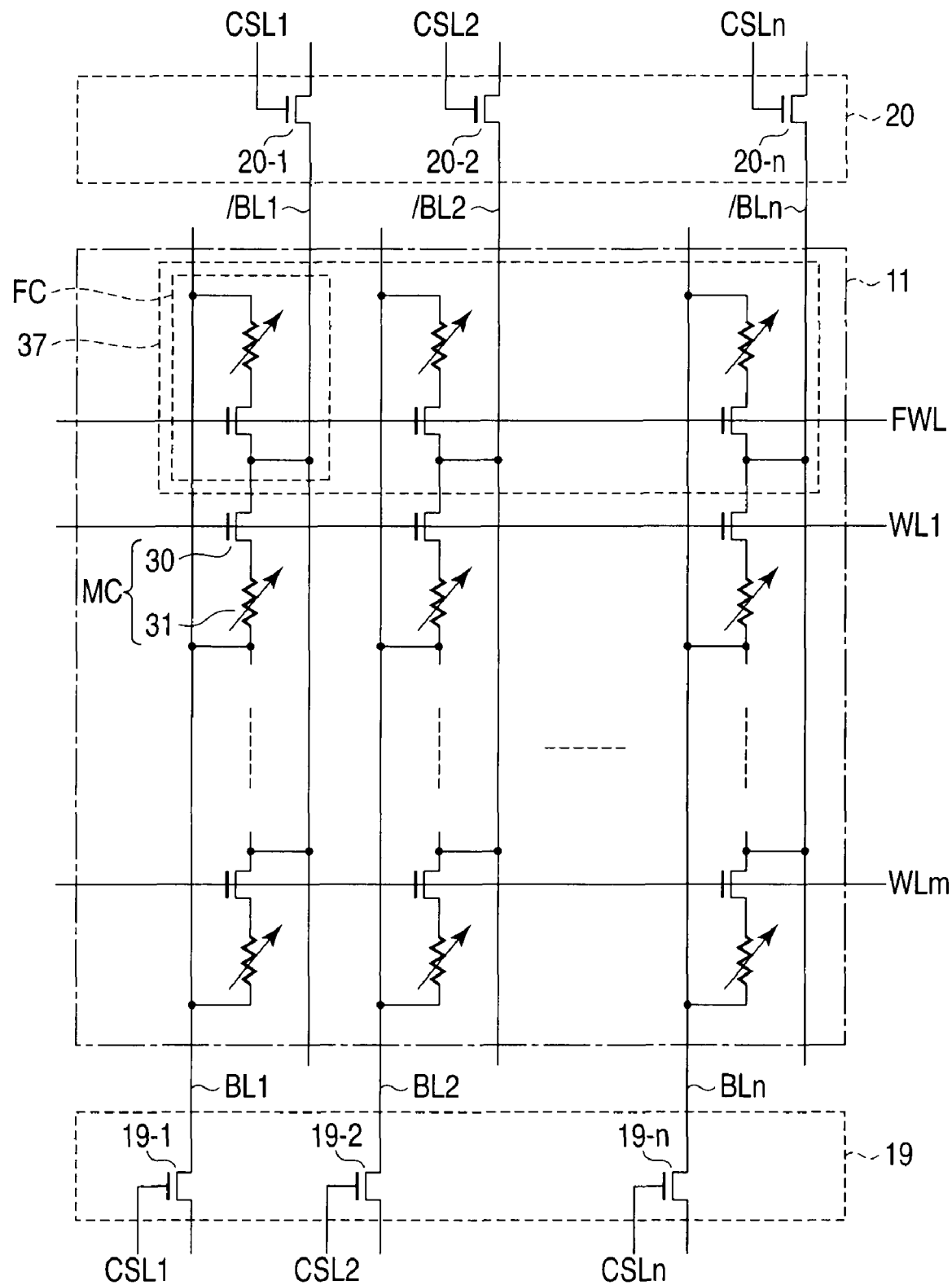
F I G. 6

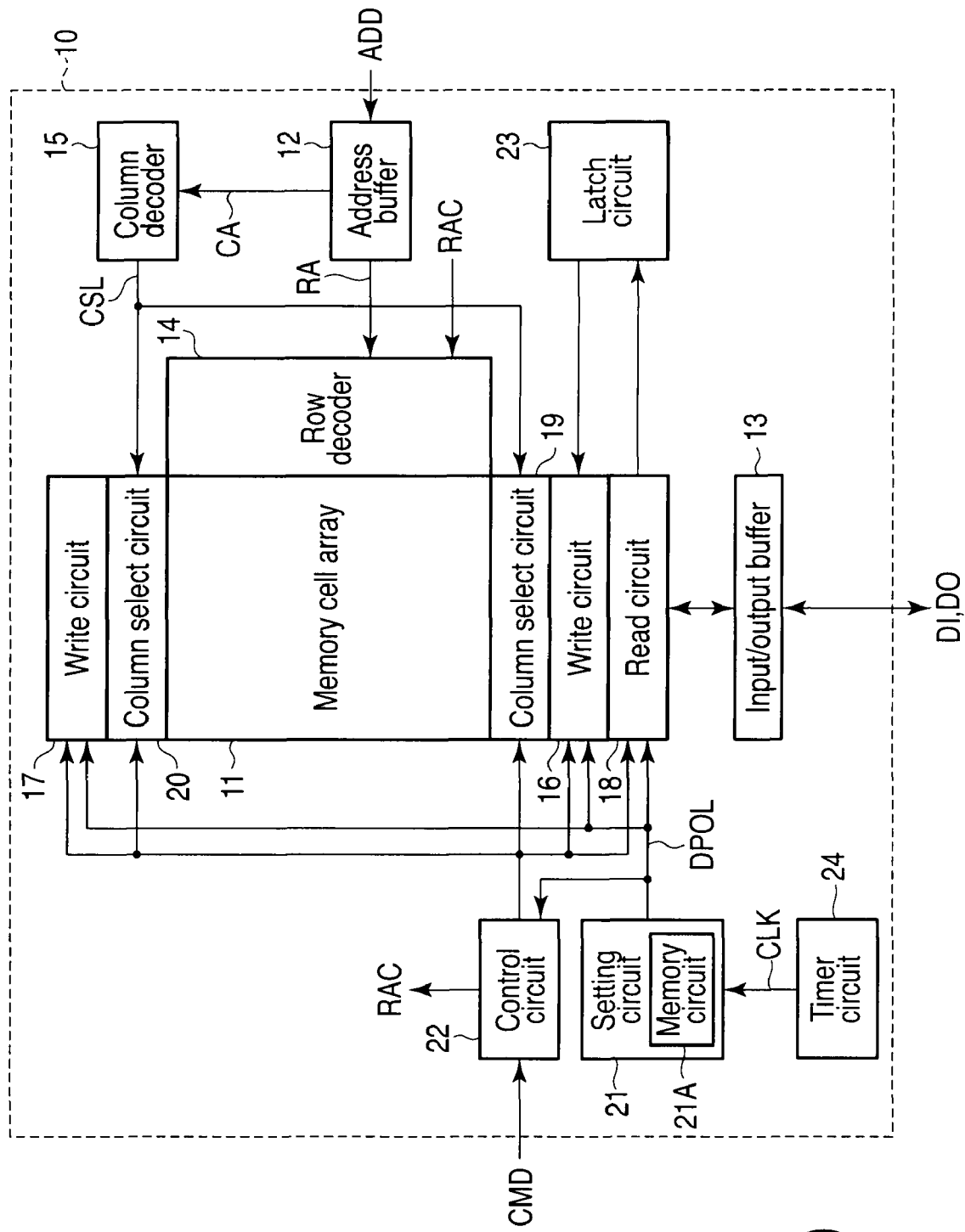
F I G. 10

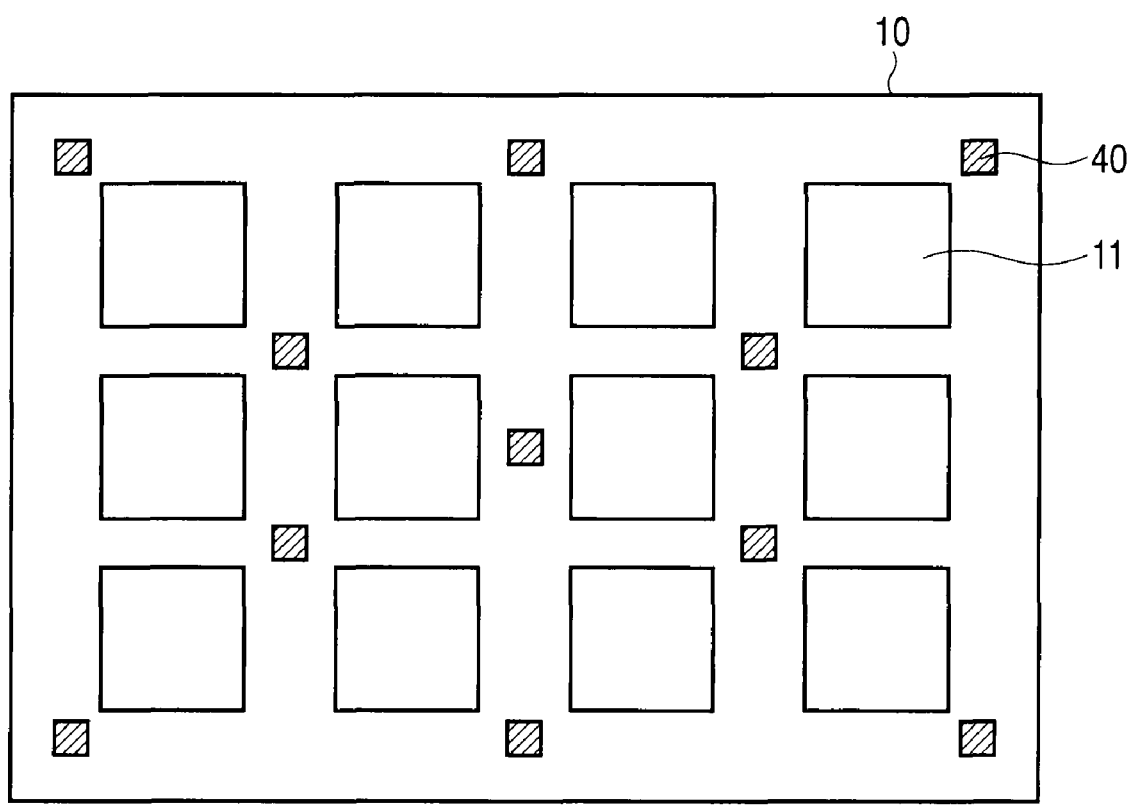
F I G. 16

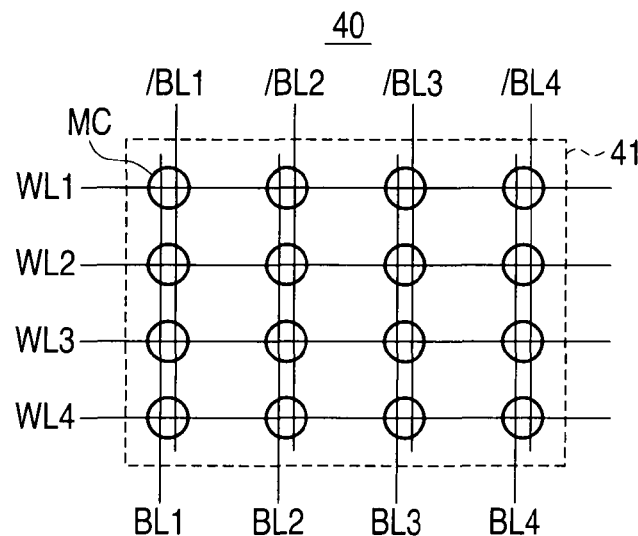
F I G. 17
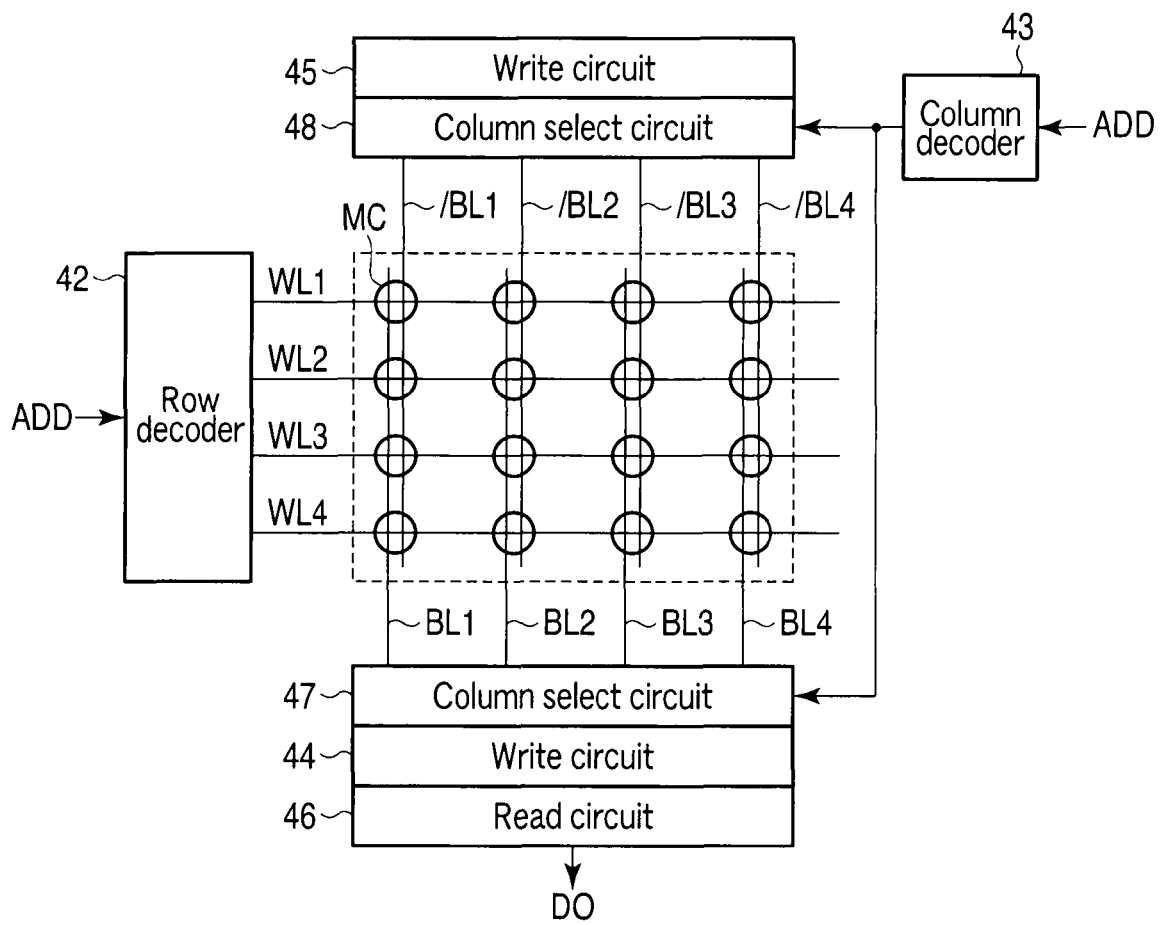
F I G. 18

SEMICONDUCTOR MEMORY DEVICE

CROSS-REFERENCE TO RELATED APPLICATIONS

This application is based upon and claims the benefit of priority from prior Japanese Patent Application No. 2007-302134, filed Nov. 21, 2007, the entire contents of which are incorporated herein by reference.

BACKGROUND OF THE INVENTION

1. Field of the Invention

This invention relates to a semiconductor memory device and a test method thereof and, for example, a semiconductor memory device using magnetoresistive elements which can record information by causing currents to flow in both directions therethrough.

2. Description of the Related Art

Recently, various types of memories which record information based on a new principle are proposed and, as one of the above memories, a magnetic random access memory (MRAM) utilizing a tunneling magnetoresistive (TMR) effect is known.

The MRAM stores "1", "0" information by means of a magnetic tunnel junction (MTJ) element. The MTJ element has a structure formed by disposing a non-magnetic layer (tunnel barrier layer) disposed between two magnetic layers (free layer and pinned layer). Information stored in the MTJ element is determined according to whether the directions of spins of the two magnetic layers are parallel or anti-parallel.

In a spin transfer torque writing type MRAM, inversion of magnetization occurs by causing a current to flow in a direction perpendicular to the film surface of the MTJ element to transfer spins into the free layer according to the flow direction of the current. When the MTJ element is of the perpendicular magnetization type, it is sufficient to provide a uniaxial anisotropy in the direction perpendicular to the film surface and it is unnecessary to provide a magnetic shape anisotropy in the plane direction unlike the case of the in-plane magnetization type. Therefore, it becomes possible to set the aspect ratio of the MTJ element to approximately 1 and reduce the size of the MTJ element to the processing limitation in principle. Further, it becomes unnecessary to provide a current-induced magnetic field wiring which generates current-induced magnetic fields in directions on two axes unlike the in-plane magnetization type. Since the operation can be performed if two terminals connected to upper and lower electrodes of the MTJ element are present, the cell area for each bit can be reduced.

Recently, a film of polysilicon magnesium oxide (MgO) oriented in a (001) plane as a tunnel barrier layer of the MTJ element is disposed between films of polysilicon CoFeB oriented in a (001) plane so as to cause MgO to act as a spin filter. Magnetization of the free layer can be inverted from anti-parallel to parallel by injecting electrons from the pinned layer to the free layer, magnetization of the free layer can be inverted from parallel to anti-parallel by injecting electrons from the free layer to the pinned layer and it is confirmed which magnesium oxide (MgO) is used as a preferable material which realizes a spin transfer torque writing type MRAM having high TMR.

In order to reduce a write current, it is necessary to reduce the volume of the free layer, saturation magnetization Ms, damping constant and the like. However, there is a physical limit on a reduction in the film thickness to reduce the volume of the free layer, there is a processing limit on a reduction in the area in the plane direction and thermal stability is degraded if the damping constant is excessively reduced. Therefore, it becomes necessary to adjust parameters so as to attain balance as a whole and reduce a write current and it is not easy to reduce the above factors. When a write current cannot be sufficiently reduced, it becomes necessary to set a desired write current by reducing the film thickness of the MgO barrier to lower the resistance thereof since the power source voltage of the circuit is normally determined. Therefore, the MgO barrier which is a constituent of the MTJ element is required to be sufficiently thin and is kept applied with high-voltage stress during the operation.

In the case of an MTJ laminated film using MgO, since the magnetoresistive ratio (MR ratio) exceeds 100% even if it is formed of a thin film, the resistance in the "1" state is set to a value which is approximately equal to or twice the resistance in the "0" state. Therefore, it is estimated that total stress applied to the film becomes greatly different when the MTJ element is set in the "0" state and a write current of "0" is caused to flow continuously and when the MTJ element is set in the "1" state and a write current of "1" is caused to flow continuously. When the stress applied thus becomes greatly different, the service life of the MTJ element becomes different.

For example, when the MRAM is used in a drive recorder as an image memory, it is estimated that there occurs a case wherein "0" information is intensively used and recorded in the MTJ element or a case wherein "1" information is more intensively recorded than "0" information depending on the condition in the application environment or the configuration of a decoder for image information. Therefore, since the service life of the MTJ element becomes different depending on the application environment, the device must be designed to cope with the worst environment as a specification of the device. Therefore, there occurs a problem that the resultant device specification must be severely set.

As the technique associated with the above technique, the following patent document is provided.

Jpn. Pat. Appln. KOKAI Publication No. 2002-343078

BRIEF SUMMARY OF THE INVENTION

According to an aspect of the present invention, there is provided a semiconductor memory device comprising: a memory cell array having a plurality of memory cells which are set into low-resistance states/high-resistance states according to "0" data/"1" data, wherein an allocation of the "0" data/"1" data and the low-resistance state/high-resistance state is switched when a power source is turned on.

According to an aspect of the present invention, there is provided a semiconductor memory device comprising: a memory cell array having a plurality of memory cells which are set into low-resistance states/high-resistance states according to "0" data/"1" data; and a timer circuit which generates a pulse at each preset time, wherein an allocation of the "0" data/"1" data and the low-resistance state/high-resistance state is switched each time the pulse is generated.

According to an aspect of the present invention, there is provided a semiconductor memory device comprising: a memory cell array having a plurality of memory cell strings, each of the memory cell strings having a plurality of memory cells which are set into low-resistance states/high-resistance states according to "0" data/"1" data; and a plurality of flag cells respectively provided for the memory cell strings and configured to store allocation information of the "0" data/"1" data and the low-resistance state/high-resistance state, wherein data write and data read operations are performed based on the allocation information.

According to an aspect of the present invention, there is provided a semiconductor memory device comprising: a memory cell array having a plurality of memory cells which are selectively set into a low-resistance state and high-resistance state according to storage data, and a plurality of measurement cells each having a same configuration as the memory cell, wherein each of the measurement cells is accessed from an exterior and outputs a characteristic thereof to the exterior.

BRIEF DESCRIPTION OF THE SEVERAL VIEWS OF THE DRAWING

FIG. 1 is a block diagram showing the configuration of a semiconductor memory device 10 according to a first embodiment of this invention.

FIG. 5 is a block diagram showing the configuration of a semiconductor memory device 10 according to an embodiment 1-2.

FIG. 6 is a circuit diagram showing the configuration of a memory cell array 11 according to an embodiment 1-3.

FIG. 10 is a block diagram showing the configuration of a semiconductor memory device 10 according to a third embodiment of this invention.

FIG. 16 is a schematic diagram showing the configuration of a semiconductor memory device 10 according to a fifth embodiment of this invention.

FIG. 17 is an equivalent circuit diagram showing the configuration of one measuring circuit 40 shown in FIG. 16.

FIG. 18 is a block diagram showing another configuration example of the measuring circuit 40.

DETAILED DESCRIPTION OF THE INVENTION

Figure 2:
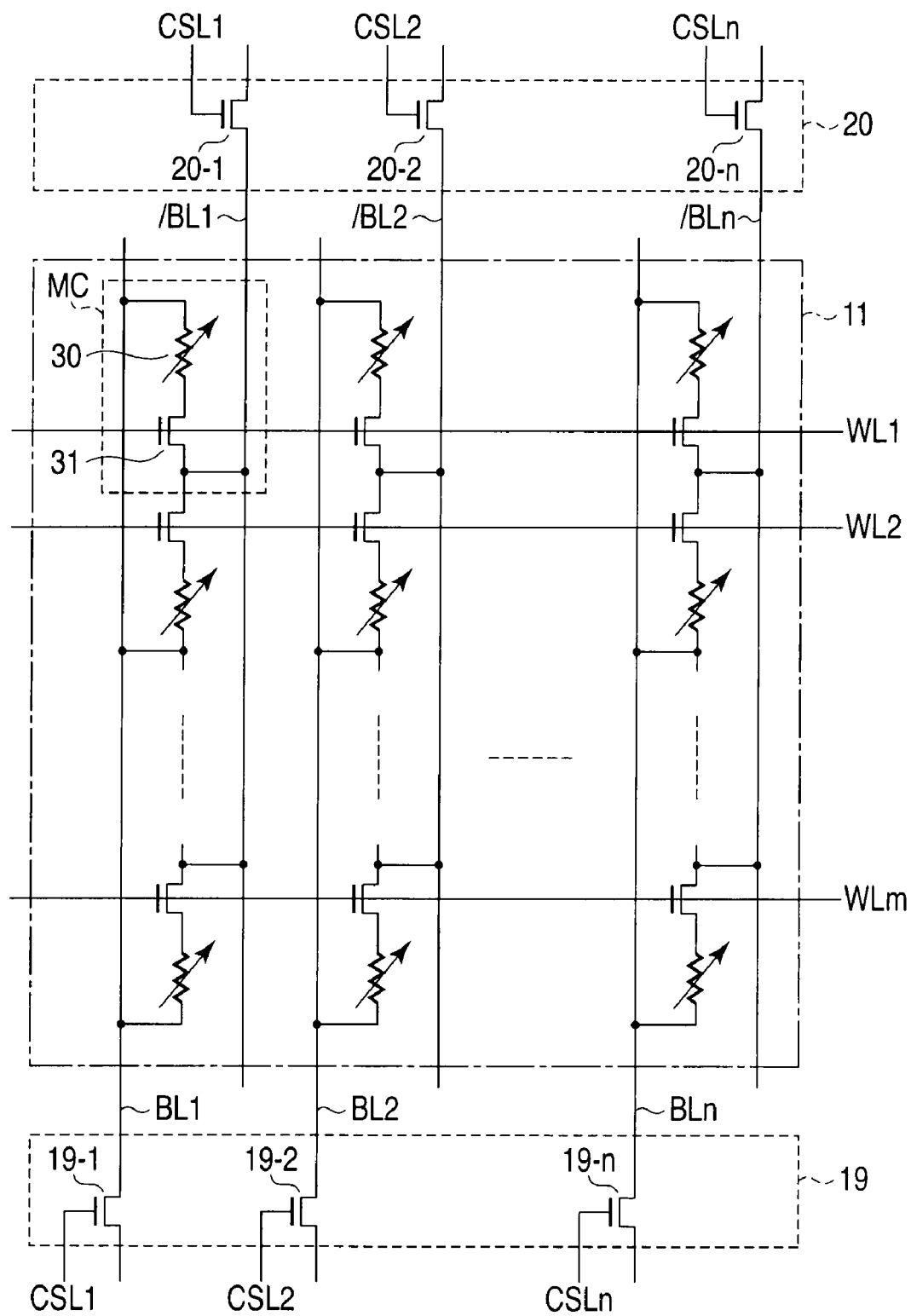
FIG. 2 is a circuit diagram showing the configuration of a memory cell array 11.

There will now be described embodiments of the present invention with reference to the accompanying drawings. In the following explanation, elements having the same functions and configurations are denoted by the same symbols and the important explanation is made only if required.

First Embodiment

FIG. 1 is a block diagram showing the configuration of a semiconductor memory device 10 according to a first embodiment of this invention. The semiconductor memory device 10 has a memory cell array 11, address buffer 12, input/output buffer 13, row decoder 14, column decoder 15, write circuits 16 and 17, read circuit 18, column select circuits 19 and 20, setting circuit 21 and control circuit 22.

The memory cell array 11 has a plurality of memory cells MC arranged in a matrix form. In the present embodiment, for example, a case wherein magnetoresistive elements are used as memory elements 30 contained in the memory cell MC is explained. FIG. 2 is a circuit diagram showing the configuration of the memory cell array 11.

In the memory cell array 11, n bit lines BL1 to BLn extending in the column direction are arranged. Further, in the memory cell array 11, n bit lines /BL1 to /BLn extending in the column direction are arranged. In addition, in the memory cell array 11, m word lines WL1 to WLm extending in the row direction are arranged. In this case, n and m are natural numbers equal to or larger than 1.

The memory cells MC are arranged in intersecting areas between the bit line pairs BL, /BL and the word lines WL. Each memory cell MC has a magnetoresistive element 30 used as the memory element and a select transistor 31. For example, the select transistor 31 is configured by an N-channel metal oxide semiconductor field effect transistor (MOS-FET).

Figure 3:
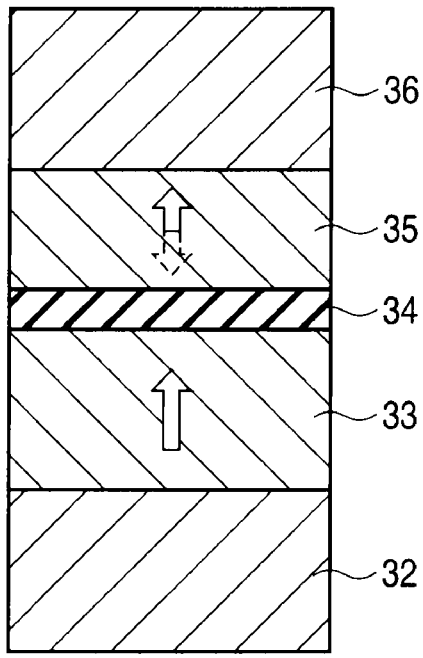
FIG. 3 is a cross-sectional view showing the structure of a magnetoresistive element 30.

FIG. 3 is a cross-sectional view showing the structure of the magnetoresistive element 30. Arrows shown in FIG. 3 indicate directions of magnetization. The magnetoresistive element 30 has a laminated structure obtained by sequentially laminating a lower electrode 32, fixed layer (or pinned layer) 33, non-magnetic layer 34, recording layer (or free layer) 35 and upper electrode 36. The lamination order of the fixed layer 33 and recording layer 35 may be reversed.

The direction of magnetization (or spin) of the fixed layer 33 is invariable (fixed). The direction of magnetization of the recording layer 35 is variable (can be inverted). The direction of easy magnetization of the fixed layer 33 and recording layer 35 may be set perpendicular to the film surface (perpendicular magnetization type) or may be set parallel to the film surface (in-plane magnetization type). When the magnetoresistive element is formed of the perpendicular magnetization type, uniaxial anisotropy may be provided in a direction perpendicular to the film surface and it is unnecessary to provide magnetic shape anisotropy in a plane direction unlike the in-plane magnetization type. Therefore, since it is possible to set the aspect ratio of the magnetoresistive element to 1 and reduce the size of the magnetoresistive element to the processing limit in principle, it becomes more preferable to use the perpendicular magnetization type from the viewpoint of miniaturization and a reduction in the write current.

As the recording layer 35 and fixed layer 33, a ferromagnetic material is used. As the non-magnetic layer 34, metal, insulator or semiconductor is used.

As a method for fixing the direction of magnetization of the fixed layer 33, for example, a coercive force differential structure can be used. That is, it is possible to configure the magnetoresistive element 30 in which the direction of magnetization of the fixed layer 33 is fixed and the direction of magnetization of the recording layer 35 is variable by setting the coercive force of the fixed layer 33 sufficiently larger than the coercive force of the recording layer 35. Alternatively, it is possible to add an antiferromagnetic layer in a position adjacent to the fixed layer 33. In this case, the direction of magnetization of the fixed layer 33 is fixed in one direction due to exchange coupling between the fixed layer 33 and the antiferromagnetic layer. At the same time, high magnetic anisotropic energy is imparted to the fixed layer 33 and a function as the fixed layer 33 is imparted due to exchange coupling between the fixed layer 33 and the antiferromagnetic layer.

One end (corresponding to the upper electrode 36) of each magnetoresistive element 30 is electrically connected to a corresponding one of the bit lines BL. The other end (corresponding to the lower electrode 32) of the magnetoresistive element 30 is electrically connected to the drain of a corresponding select transistor 31. The source of the select transistor 31 is electrically connected to the bit line /BL. The gate of the select transistor 31 is electrically connected to a corresponding one of the word lines WL.

The address buffer 12 receives an address signal ADD from the exterior. Then, the address buffer 12 transmits a column address signal CA among the address signal ADD to the column decoder 15 and transmits a row address signal RA to the row decoder 14.

The row decoder 14 decodes the row address signal RA to attain a row address decode signal. Then, the row decoder 14 selects one of the word lines WL1 to WLm based on the row address decode signal.

The column decoder 15 decodes the column address signal CA to attain column select signals CSL1 to CSLn. The column select signals CSL1 to CSLn are supplied to the column select circuits 19 and 20.

The bit lines BL1 to BLn are connected to the write circuit 16 and read circuit 18 via the column select circuit 19. The column select circuit 19 connects a selected bit line BL to the write circuit 16 (or read circuit 18) based on the column select signal CSL. The column select circuit 19 has switch elements 19-1 to 19-*n* corresponding to the bit lines BL1 to BLn. The switch elements 19-1 to 19-*n* are formed of N-channel MOSFETs, for example. The gates of the NMOSFETs 19-1 to 19-*n* are respectively supplied with the column select signals CSL1 to CSLn.

The bit lines /BL1 to /BLn are connected to the write circuit 17 via the column select circuit 20. The column select circuit 20 connects a selected bit line /BL to the write circuit 17 based on the column select signal CSL. The column select circuit 20 has switch elements 20-1 to 20-*n* corresponding to the bit lines /BL1 to /BLn. The switch elements 20-1 to 20-*n* are formed of N-channel MOSFETs, for example. The gates of the NMOSFETs 20-1 to 20-*n* are respectively supplied with the column select signals CSL1 to CSLn.

The write circuits 16 and 17 write data to a selected memory cell MC. Specifically, the write circuits 16 and 17 supply a write current of a direction corresponding to data between the selected bit lines BL and /BL.

The read circuit 18 reads data from the selected memory cell MC. Specifically, the read circuit 18 reads data from the selected memory cell MC by detecting a current flowing in the selected bit lines BL and /BL or a voltage between the selected bit lines BL and /BL.

The input/output buffer 13 receives input data DI from the exterior. The input data DI is supplied to the write circuits 16 and 17 as write data. Further, the input/output buffer 13 receives read data from the read circuit 18 and outputs the read data to the exterior as output data DO.

The control circuit 22 receives various commands (containing a write command, read command and erase command) from the exterior. The control circuit 22 controls the respective circuits of the semiconductor memory device 10 according to the commands. For example, the control circuit 22 supplies a write signal to the write circuits 16 and 17 in response to a write command.

The setting circuit 21 receives an on/off signal from the exterior. The on/off signal is a signal indicating that the power source of the system on which the semiconductor memory device 10 is mounted is on or off. The on/off signal is made high when the power source of the system is on and made low when the power source is off. The setting circuit 21 generates a switching signal DPOL based on the on/off signal.

The semiconductor memory device 10 of the present embodiment is operated in response to the on/off signal indicating that the system is on or off. That is, the semiconductor memory device 10 is used in a non-all-night operation type (discontinuous operation type) system that is repeatedly set on and off.

Figure 4:
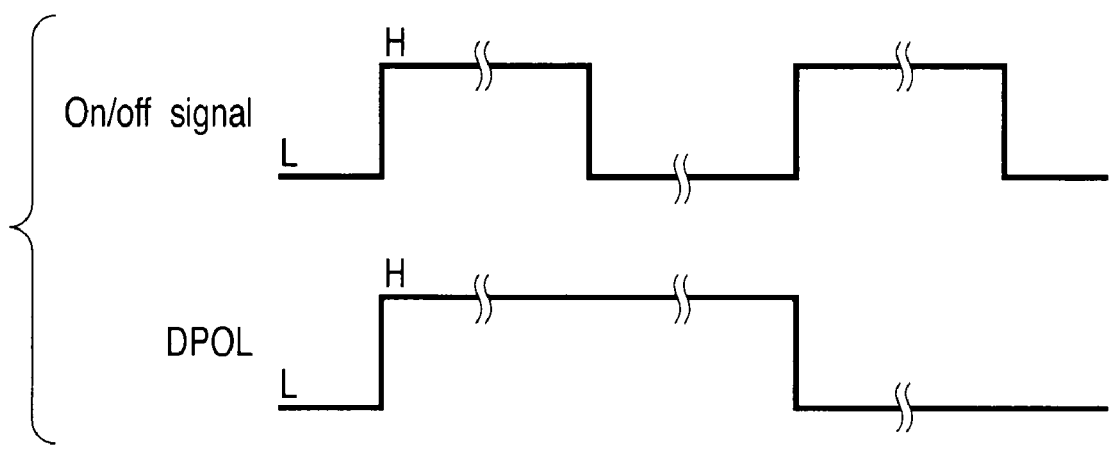
FIG. 4 is a timing chart for illustrating the operation of a setting circuit 21.

FIG. 4 is a timing chart for illustrating the operation of the setting circuit 21. The setting circuit 21 switches the high and low levels of the switching signal DPOL by using the rising edge of the on/off signal as a trigger (that is, when the system is turned on). As shown in FIG. 4, the setting circuit 21 makes the switching signal DPOL high on the first rising edge of the on/off signal. Then, the setting circuit 21 makes the switching signal DPOL low on the next rising edge of the on/off signal. Subsequently, the setting circuit 21 repeatedly performs the same operation. The switching signal DPOL is supplied to the write circuits 16, 17 and read circuit 18.

Next, the operation of the semiconductor memory device 10 thus configured is explained. The magnetoresistive element 30 of the present embodiment is a spin transfer torque writing type magnetoresistive element. Therefore, when data is written to the magnetoresistive element 30, currents are caused to bidirectionally flow in a direction perpendicular to the film surface (or a laminated layer surface) of the magnetoresistive element 30. The operation of writing data to the magnetoresistive element 30 is explained below.

First, a memory cell MC in which data is to be written is selected by selecting the bit line pair BL, /BL and word line WL. Then, the write circuits 16 and 17 applies voltage between the selected bit lines BL and /BL to cause a write current corresponding to data to flow into the magnetoresistive element 30 contained in the selected memory cell MC.

That is, when electrons from the fixed layer 33 (that is, electrons moving from the fixed layer 33 to the recording layer 35) are supplied, electrons having spins polarized in the same direction as the direction of magnetization of the fixed layer 33 are injected into the recording layer 35. In this case, the direction of magnetization of the recording layer 35 is set in the same direction as the direction of magnetization of the fixed layer 33. As a result, the directions of magnetization of the fixed layer 33 and recording layer 35 are set in the parallel arrangement. The resistance of the magnetoresistive element 30 becomes the minimum (the low-resistance state is set) when the parallel arrangement is set.

On the other hand, when electrons from the recording layer 35 (that is, electrons moving from the recording layer 35 to the fixed layer 33) are supplied, electrons reflected from the fixed layer 33 and having spins polarized in the direction opposite to the direction of magnetization of the fixed layer 33 are injected into the recording layer 35. In this case, the direction of magnetization of the recording layer 35 is set in the direction opposite to the direction of magnetization of the fixed layer 33. As a result, the directions of magnetization of the fixed layer 33 and recording layer 35 are set in the anti-parallel arrangement. The resistance of the magnetoresistive element 30 becomes the maximum (the high-resistance state is set) when the anti-parallel arrangement is set.

The operation of reading data from the magnetoresistive element 30 is performed as follows. The selection operation of a memory cell MC is the same as that explained in the case of the write operation. A read current is supplied to the magnetoresistive element 30 by the read circuit 18. The read current is set to a value that does not cause the direction of magnetization of the recording layer 35 to be inverted (that is, a value that is smaller than the write current). Data stored in the magnetoresistive element 30 can be read by detecting a variation in the resistance of the magnetoresistive element 30 at this time by means of a sense amplifier or the like contained in the read circuit 18.

The write circuits 16 and 17 switch allocations of the low-resistance state and high-resistance state of the magnetoresistive element 30 and (or to) "0" and "1" data items according to the state (high or low) of the switching signal DPOL. That is, the write circuits 16 and 17 supply a write current to the magnetoresistive element 30 to set the low-resistance state to "0" data and set the high-resistance state to "1" data when the switching signal DPOL is low. Further, the write circuits 16 and 17 supply a write current to the magnetoresistive element 30 to impart an inverted allocation, that is, set the low-resistance state to "1" data and set the high-resistance state to "0" data when the switching signal DPOL is high.

Likewise, the read circuit 18 switches allocations of the low-resistance state and high-resistance state of the magnetoresistive element 30 and "0" and "1" data items according to the state (high or low) of the switching signal DPOL. That is, the read circuit 18 outputs read data to set the low-resistance state to "0" data and set the high-resistance state to "1" data when the switching signal DPOL is low. Further, the read circuit 18 outputs read data to impart an inverted allocation, that is, set the low-resistance state to "1" data and set the high-resistance state to "0" data when the switching signal DPOL is high.

The setting circuit 21 has a memory circuit 21A that stores allocations of "0" data/"1" data and the low-resistance state/high-resistance state (that is, the states of the switching signal DPOL). The memory circuit 21A may be a latch circuit configured by MOSFETs used in a static random access memory (SRAM) in the case of a system that can be backed-up by a battery, but can use a nonvolatile memory element that is the same as the memory cell, for example, in the case of a system whose power source is completely turned off. In either case, it can be formed without adding an extra manufacturing process.

More specific embodiments of the first embodiment are explained below.

Embodiment 1-1

The embodiment 1-1 shows an example in which the semiconductor memory device 10 is used as a volatile RAM circuit.

First, at the starting time of the system (on the rising edge of the on/off signal), the write circuits 16 and 17 initialize the memory cell array 11 by writing "1" data or "0" data to all of bits in the memory cell array 11.

Specifically, the control circuit 22 detects starting of the system by receiving the on/off signal. Next, the control circuit 22 supplies a write signal to the write circuits 16 and 17. Subsequently, the control circuit 22 supplies a row address signal RAC to the row decoder 14 and a column select signal CSL to the column select circuits 19 and 20 to sequentially select the memory cells MC. The selection operation can be performed to simultaneously select a plurality of memory cells MC (for example, for each column unit or for each row unit). Then, the write circuits 16 and 17 write erase data to the selected memory cell MC. Thus, "1" data or "0" data can be written to all of the bits in the memory cell array 11 at the initialization time.

Subsequently, the write circuits 16 and 17 perform the data writing operation based on the switching signal DPOL. Likewise, the read circuit 18 performs the data read operation based on the switching signal DPOL.

Embodiment 1-2

The embodiment 1-2 shows an example in which the semiconductor memory device 10 is used as a nonvolatile RAM circuit. FIG. 5 is a block diagram showing the configuration of the semiconductor memory device 10 according to the embodiment 1-2.

The semiconductor memory device 10 has a latch circuit 23. The latch circuit 23 latches read data read from the memory cell array 11 by means of the read circuit 18 and transmits the thus latched data to the write circuits 16 and 17.

In this embodiment, the rewrite operation (initialization operation) of reading data items from all of the bits in the memory cell array 11 and rewriting (writing back) inverted data items obtained by inverting the thus read data items to the memory cell array 11 is performed at the starting time of the system.

First, the control circuit 22 detects starting of the system by receiving the on/off signal. Next, the control circuit 22 supplies a row address signal RAC to the row decoder 14 and a column select signal CSL to the column select circuits 19 and 20 to sequentially select the memory cells MC. The selection operation can be performed to simultaneously select a plurality of memory cells MC (for example, for each column unit or for each row unit). Then, the read circuit 18 reads data from the selected memory cell MC. The thus read data is supplied to and latched in the latch circuit 23.

Subsequently, the read data latched in the latch circuit 23 is supplied to the write circuits 16 and 17. Then, the control circuit 22 selects one of the memory cells MC that is the same as a memory cell subjected to the read operation. Next, the write circuits 16 and 17 write inverted data obtained by inverting the read data to the selected memory cell MC. The above operation is repeatedly performed until data items of all of the bits are inverted.

After all of the data items of the memory cell array 11 are inverted, the write circuits 16 and 17 perform the data write operation based on the switching signal DPOL. Likewise, the read circuit 18 performs the data read operation based on the switching signal DPOL.

Embodiment 1-3

In the embodiment 1-3, the initialization operation (rewrite operation) explained in the embodiment 1-2 is not performed at the starting time of the system. Inverted data items are rewritten to a plurality of memory cell columns connected to a bit line to which a memory cell MC subjected to a data write or read operation is connected when the above bit line is first accessed. Thus, the initialization operation explained in the embodiment 1-2 can be omitted and, as a result, the starting period of the semiconductor memory device 10 can be reduced.

FIG. 6 is a circuit diagram showing the configuration of the memory cell array 11 according to the embodiment 1-3. The block diagram of the semiconductor memory device 10 is the same as that of FIG. 5.

The memory cell array 11 has a flag cell string 37 and the flag cell string 37 is configured by n flag cells FC arranged in the row direction. Each flag cell FC has the same configuration as the memory cell MC and is configured by a magnetoresistive element 30 and select transistor 31. The n flag cells FC are respectively connected to the bit line pairs BL1 to BLn and /BL1 to /BLn. Further, the n flag cells FC are connected to a common word line FWL. The word line FWL is connected to the row decoder 14.

The operation of the semiconductor memory device 10 thus configured is explained. It is supposed that, for example, "0" data is written to all of the flag cells FC. First, when the system is started, the on/off signal goes high. The setting circuit 21 receives the on/off signal and generates a high switching signal DPOL. Thus, the read circuit 18 outputs read data to set the low-resistance state to "1" data and set the high-resistance state to "0" data. In this stage, the initialization operation (rewrite operation) is not performed.

Next, the bit line pair BL, /BL connected to the memory cell MC subjected to the write or read operation is selected by means of the column decoder 15. Then, the control circuit 22 selects the word line FWL by using a row address signal RAC. Thus, data of the flag cell FC connected to the selected bit line is read by means of the read circuit 18. At this time, since the switching signal DPOL is high, data of the flag cell FC is read as "1" data.

The control circuit 22 confirms data read from the flag cell FC. The rewrite operation of inverted data is performed if the data is "1" data and the rewrite operation of inverted data is not performed if the data is "0" data. In this embodiment, since data items of all of the flag cells FC are read as "1" data, the rewrite operation is performed for a column (bit line) corresponding to the flag cell FC when the flag cell FC is first accessed.

That is, the control circuit 22 sequentially selects the memory cells MC in the selected column by supplying a row address signal RAC to the row decoder 14. Then, the read circuit 18 reads data from the selected memory cell MC. The read data is transmitted to and latched in the latch circuit 23.

Subsequently, the read data latched in the latch circuit 23 is supplied to the write circuits 16 and 17. Next, the control circuit 22 sequentially selects the memory cells MC in the selected column. Then, the write circuits 16 and 17 sequentially write inverted data items obtained by inverting the read data items to the selected memory cells MC.

In the rewrite operation, data of the flag cell FC is also inverted (replaced by "0" data). Thus, when the on/off signal goes high again and the switching signal DPOL goes low, data of the flag cell FC is read as "1" data. Therefore, when each flag cell FC is first accessed, the rewrite operation is performed for a column (bit line) corresponding to the flag cell FC.

After data items of one column of the memory cell array 11 are inverted, the write circuits 16 and 17 perform the data write operation for the column based on the switching signal DPOL. Likewise, the read circuit 18 performs the data read operation based on the switching signal DPOL.

In the embodiment 1-3, the system in which the flag bits are arranged for the respective bit lines is explained, but flag bits may be arranged in the word line unit or block unit in some cases. In this case, the operation principle is the same as that in the case wherein the flag bits are arranged for the respective bit lines.

As described above, according to the first embodiment, since the low-resistance state and high-resistance state of the magnetoresistive element 30 are switched for each preset period, biased stress can be prevented from being kept applied to the magnetoresistive element 30 that stores the same data for a long time. That is, even if the magnetoresistive element 30 normally stores the same data for a long time, inverted data can be stored therein after a preset period has elapsed by applying this embodiment. As a result, the service life of the memory cell MC can be elongated by suppressing an influence of an unbalanced application environment.

Further, since this embodiment can be applied to both the volatile RAM and nonvolatile RAM, it can be used in memories for various applications.

Second Embodiment

A semiconductor memory device 10 according to the second embodiment is used in a non-all-night operation type (discontinuous operation type) system that is repeatedly set on and off. Further, the second embodiment contains a timer circuit that generates a clock and the level of a first switching signal DPOLX output from a setting circuit 21 is changed for each period of the clock. In addition, the state of the first switching signal DPOLX on the rising edge of an on/off signal is used as a second switching signal DPOL and a data write operation and read operation are performed based on the second switching signal DPOL.

Figure 7:
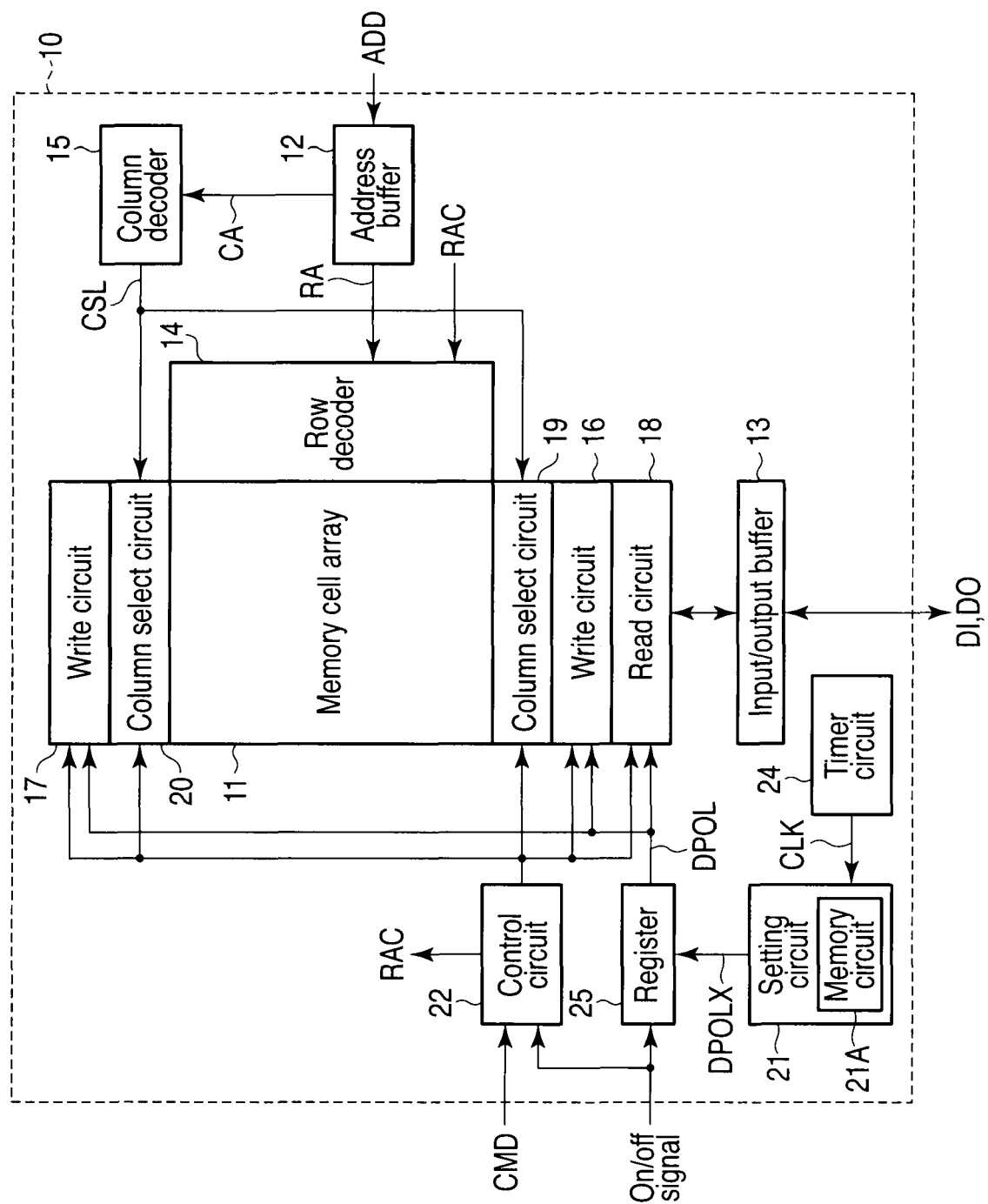
FIG. 7 is a block diagram showing the configuration of a semiconductor memory device 10 according to a second embodiment of this invention.

FIG. 7 is a block diagram showing the configuration of the semiconductor memory device 10 according to the second embodiment of this invention. The semiconductor memory device 10 has a timer circuit 24 and register 25.

The timer circuit 24 generates a pulse for each preset period. The timer circuit 24 supplies a clock CLK having a plurality of pulse strings to the setting circuit 21. The setting circuit 21 switches the high and low levels of the first switching signal DPOLX by using the rising edge of the clock CLK as a trigger.

Figure 8:
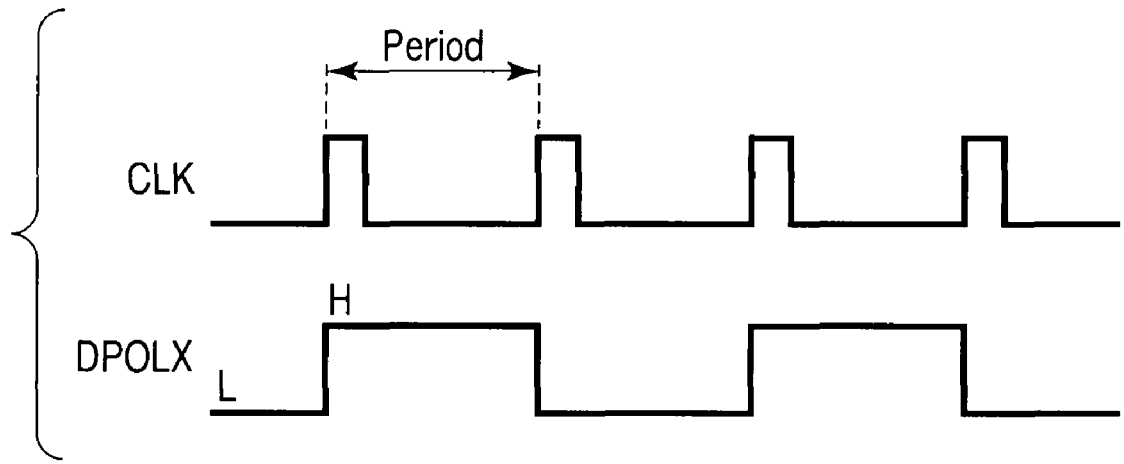
FIG. 8 is a timing chart for illustrating the operations of a timer circuit 24 and setting circuit 21.

FIG. 8 is a timing chart for illustrating the operations of the timer circuit 24 and setting circuit 21. The setting circuit 21 makes the first switching signal DPOLX high on the first rising edge of the clock CLK. Then, the setting circuit 21 makes the first switching signal DPOLX low on the next rising edge of the clock CLK. Subsequently, the setting circuit 21 repeatedly performs the above operation. The first switching signal DPOLX is supplied to the register 25.

It is common practice to assure that the service life of an insulating film used in the semiconductor memory device is 10 years in the actual application condition. Therefore, it is important to set the period of the clock CLK sufficiently shorter than the above period. However, in this embodiment, since it is assumed that the semiconductor memory device is used in a non-all-night operation type system, it is supposed that it is triggered on each day on average and the period of the clock is set approximately equal to or slightly longer than the above period. For example, the period of the clock CLK is appropriately set to one day, one week or one month.

The setting circuit 21 has a memory circuit 21A that stores allocations of "0" data/"1" data and (or to) the low-resistance state/high-resistance state (that is, the states of the switching signal DPOLX). The memory circuit 21A may be a latch circuit such as an SRAM having MOSFETs in the case of a system that can be backed-up by a battery, but can use a nonvolatile memory element that is the same as the memory cell element, for example, in the case of a system whose power source is completely turned off. In either case, it can be formed without adding an extra manufacturing process.

The register 25 holds the first switching signal DPOLX. Further, the register 25 receives an on/off signal indicating the on state or off state of the system from the exterior. The register 25 outputs the state of the first switching signal DPOLX at this time as a second switching signal DPOL by using the rising edge of the on/off signal as a trigger. The second switching signal DPOL is supplied to the write circuits 16 and 17 and read circuit 18.

The data write operation and read operation using the second switching signal DPOL and on/off signal are the same as those of the first embodiment.

More specific embodiments of the second embodiment are explained below.

Embodiment 2-1

The embodiment 2-1 shows an example in which the semiconductor memory device 10 is used as a volatile RAM circuit. That is, the embodiment 2-1 is obtained by applying the second embodiment to the embodiment 1-1.

First, at the starting time of the system (on the rising edge of the on/off signal), the write circuits 16 and 17 initialize the memory cell array 11 by writing "1" data or "0" data to all of bits in the memory cell array 11.

Specifically, the control circuit 22 detects starting of the system by receiving the on/off signal. Next, the control circuit 22 supplies a write signal to the write circuits 16 and 17. Subsequently, the control circuit 22 supplies a row address signal RAC to the row decoder 14 and supplies a column select signal CSL to the column select circuits 19 and 20 to sequentially select the memory cells MC. The selection operation can be performed to simultaneously select a plurality of memory cells MC (for example, for each column unit or for each row unit). Then, the write circuits 16 and 17 write erase data to the selected memory cell MC. Thus, "1" data or "0" data can be written to all of the bits in the memory cell array 11 at the initialization time.

Further, the register 25 outputs a switching signal DPOL by using the first switching signal DPOLX and on/off signal. Subsequently, the write circuits 16 and 17 perform the data write operation based on the switching signal DPOL. Likewise, the read circuit 18 performs the data read operation based on the switching signal DPOL.

Embodiment 2-2

Figure 9:
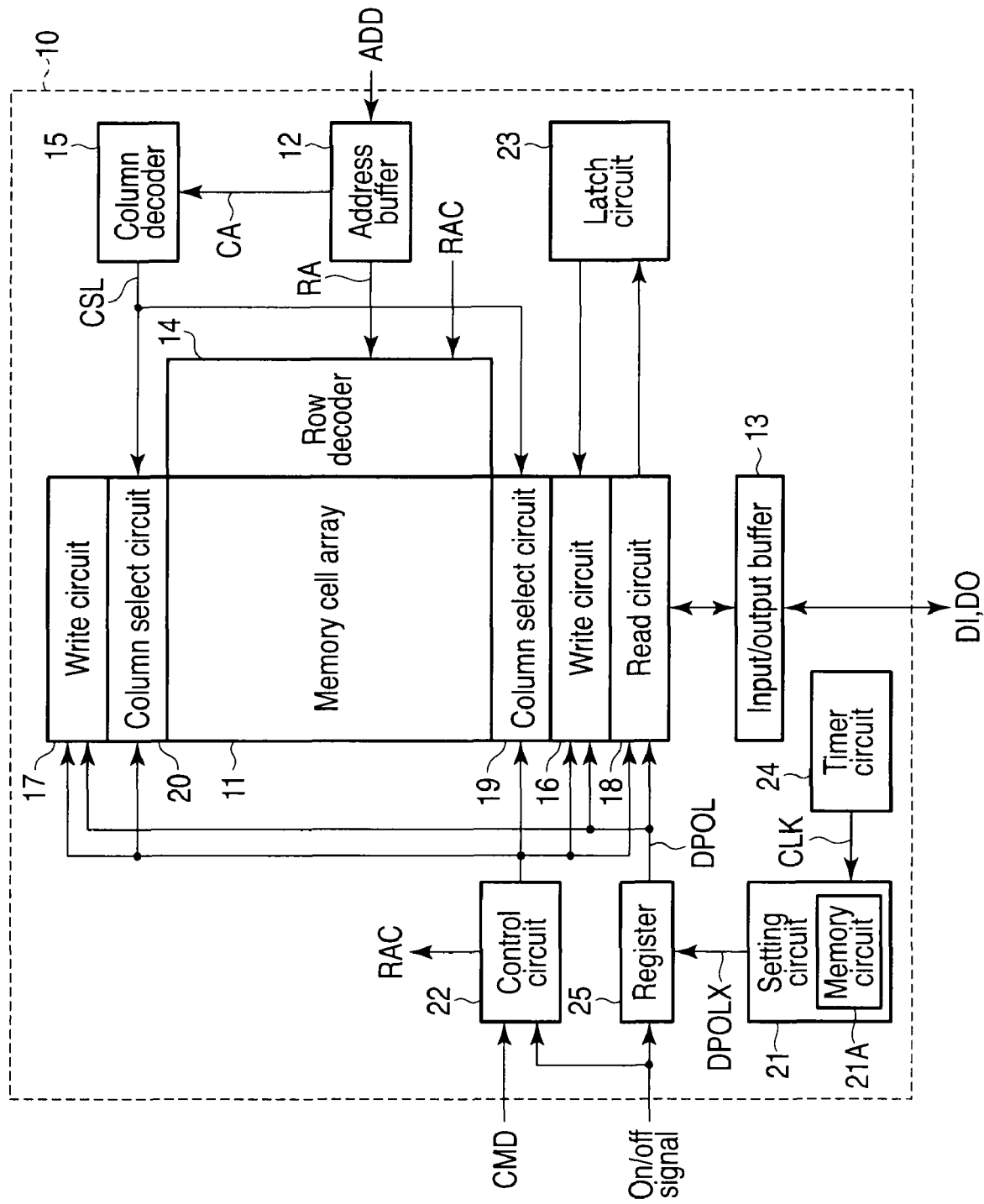
FIG. 9 is a block diagram showing the configuration of a semiconductor memory device 10 according to an embodiment 2-2.

The embodiment 2-2 shows an example in which the semiconductor memory device 10 is used as a nonvolatile RAM circuit. That is, the embodiment 2-2 is obtained by applying the second embodiment to the embodiment 1-2. FIG. 9 is a block diagram showing the configuration of the semiconductor memory device 10 according to the embodiment 2-2.

The semiconductor memory device 10 has a latch circuit 23. The latch circuit 23 latches read data read from the memory cell array 11 by means of the read circuit 18 and transmits the thus latched data to the write circuits 16 and 17.

In this embodiment, the operation of reading data items from all of the bits in the memory cell array 11 and rewriting inverted data items obtained by inverting the thus read data items to the memory cell array 11 is performed at the starting time of the system. The rewrite operation (initialization operation) is the same as that of the embodiment 1-2.

The register 25 outputs a second switching signal DPOL by using the first switching signal DPOLX and on/off signal. After all of the data items of the memory cell array 11 are inverted, the write circuits 16 and 17 perform the data write operation based on the switching signal DPOL. Likewise, the read circuit 18 performs the data read operation based on the switching signal DPOL.

Embodiment 2-3

The embodiment 2-3 is obtained by applying the second embodiment to the embodiment 1-3. That is, in the embodiment 2-3, the initialization operation (rewrite operation) explained in the embodiment 2-2 is not performed at the starting time of the system. Inverted data items are rewritten to a plurality of memory cell columns connected to a bit line to which a memory cell MC subjected to a data write operation or read operation is connected when the above bit line is first accessed. The configuration of the memory cell array 11 is the same as that of FIG. 6 and the memory cell array 11 has n flag cells FC corresponding to bit line pairs BL1 to BLn and /BL1 to /BLn.

The operation of rewriting inverted data by using the latch circuit 23 is the same as that in the embodiment 1-3. Further, the write circuits 16 and 17 perform the data write operation based on the switching signal DPOL from the register 25. Likewise, the read circuit 18 performs the data read operation based on the switching signal DPOL from the register 25.

As described above, in the second embodiment, like the first embodiment, the service life of the memory cell MC can be elongated by suppressing an influence of an unbalanced application environment.

Third Embodiment

A semiconductor memory device 10 of the third embodiment is used in an all-night operation type (continuous operation type) system such as an engineering workstation (EWS) or general-purpose computer for large-scale system control that is on for a long time. Therefore, in the semiconductor memory device 10 of the third embodiment, a switching signal DPOL is generated by using a clock CLK generated from a timer circuit without using an on/off signal indicating the on state or off state of the system.

FIG. 10 is a block diagram showing the configuration of the semiconductor memory device 10 according to the third embodiment of this invention. The semiconductor memory device 10 has a timer circuit 24.

The timer circuit 24 generates a pulse for each preset period. The timer circuit 24 supplies the clock CLK including a plurality of pulse strings to a setting circuit 21. The setting circuit 21 switches the high and low levels of the switching signal DPOL by using the rising edge of the clock CLK as a trigger.

It is common practice to assure that the service life of an insulating film used in the semiconductor memory device is 10 years in the actual application condition. Therefore, it is important that the period of the clock CLK is set sufficiently shorter than the above period. However, since it is assumed that this embodiment is used in an all-night operation type system, time loss of the system operation occurs if the period is set excessively short. Therefore, for example, the period of the clock CLK is set to appropriately one day, one week or one month.

Figure 11:
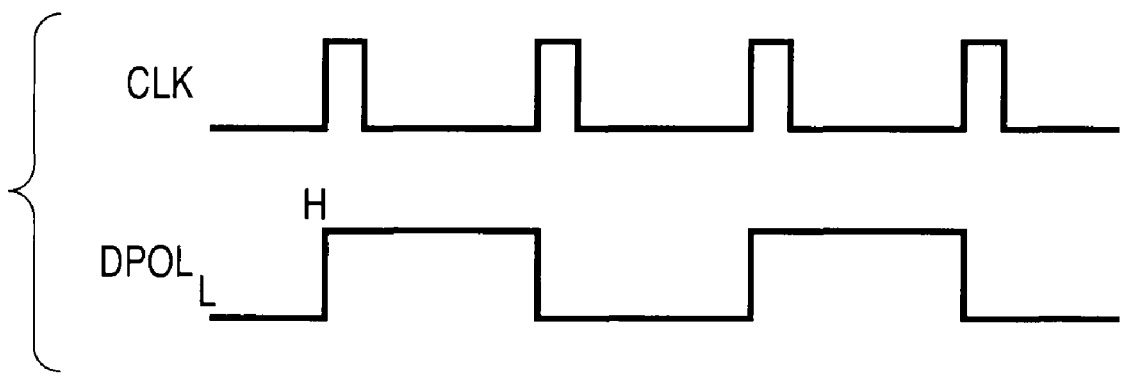
FIG. 11 is a timing chart for illustrating the operations of a timer circuit 24 and setting circuit 21.

FIG. 11 is a timing chart for illustrating the operations of the timer circuit 24 and setting circuit 21. The setting circuit 21 makes the switching signal DPOL high on the first rising edge of the clock CLK. Then, the setting circuit 21 makes the switching signal DPOL low on the next rising edge of the clock CLK. Subsequently, the setting circuit 21 repeatedly performs the above operation. The switching signal DPOL is supplied to the write circuits 16, 17 and read circuit 18.

The write circuits 16 and 17 switch allocations of the low-resistance state and high-resistance state of the magnetoresistive element 30 and "0" and "1" data items according to the state (high or low) of the switching signal DPOL. That is, the write circuits 16 and 17 supply a write current to the magnetoresistive element 30 to set the low-resistance state to "0" data and set the high-resistance state to "1" data when the switching signal DPOL is low. Further, the write circuits 16 and 17 supply a write current to the magnetoresistive element 30 to impart an inverted allocation, that is, set the low-resistance state to "1" data and set the high-resistance state to "0" data when the switching signal DPOL is high.

Likewise, the read circuit 18 switches allocations of the low-resistance state and high-resistance state of the magnetoresistive element 30 and "0" and "1" data items according to the state (high or low) of the switching signal DPOL. That is, the read circuit 18 outputs read data to set the low-resistance state to "0" data and set the high-resistance state to "1" data when the switching signal DPOL is low. Further, the read circuit 18 outputs read data to impart an inverted allocation, that is, set the low-resistance state to "1" data and set the high-resistance state to "0" data when the switching signal DPOL is high.

More specific embodiments of the third embodiment are explained below.

Embodiment 3-1

The embodiment 3-1 shows an example in which the semiconductor memory device 10 is used as a nonvolatile RAM circuit. That is, the embodiment 3-1 is obtained by applying the third embodiment to the embodiment 1-2. The configuration of the semiconductor memory device 10 according to the embodiment 3-1 is the same as that of FIG. 10.

As shown in FIG. 10, the semiconductor memory device 10 has a latch circuit 23. The latch circuit 23 latches read data read from the memory cell array 11 by means of the read circuit 18 and transmits the thus latched data to the write circuits 16 and 17.

In this embodiment, the rewrite operation (initialization operation) of reading data items from all of the bits in the memory cell array 11 and rewriting inverted data items obtained by inverting the thus read data items to the memory cell array 11 is performed during a first period when the switching signal DPOL is inverted.

When the switching signal DPOL is inverted, the control circuit 22 supplies a row address signal RAC to the row decoder 14 and supplies a column select signal CSL to the column select circuits 19 and 20 to sequentially select the memory cells MC. The selection operation can be performed to simultaneously select a plurality of memory cells MC (for example, for each column unit or for each row unit). Then, the read circuit 18 reads data from the selected memory cell MC. The thus read data is supplied to and latched in the latch circuit 23.

Subsequently, the read data latched in the latch circuit 23 is supplied to the write circuits 16 and 17. Then, the control circuit 22 selects the memory cell MC that is the same as a memory cell subjected to the read operation. Subsequently, the write circuits 16 and 17 write inverted data obtained by inverting the read data to the selected memory cell MC. The above operation is repeatedly performed until data items of all of the bits are inverted.

After all of the data items of the memory cell array 11 are inverted, the write circuits 16 and 17 perform the data write operation based on the switching signal DPOL. Likewise, the read circuit 18 performs the data read operation based on the switching signal DPOL.

Embodiment 3-2

The embodiment 3-2 is obtained by applying the third embodiment to the embodiment 1-3. That is, in the embodiment 3-2, inverted data items are rewritten to a plurality of memory cell columns connected to a bit line to which a memory cell MC subjected to the data write operation or data read operation is connected when the above bit line is first accessed without performing the rewrite operation (initialization operation) explained in the embodiment 3-1 when the switching signal DPOL is inverted. The configuration of the memory cell array 11 is the same as that of FIG. 6 and the memory cell array 11 has n flag cells FC corresponding to the bit line pairs BL1 to BLn and /BL1 to /BLn.

The operation of the semiconductor memory device 10 thus configured is explained. It is supposed that, for example, "0" data is written to all of the flag cells FC. First, if the clock CLK is generated from the timer circuit 24, the setting circuit 21 inverts a switching signal DPOL in response to the clock CLK. In this embodiment, for example, it is assumed that the switching signal DPOL goes high. Thus, the read circuit 18 outputs read data to set the low-resistance state to "1" data and set the high-resistance state to "0" data. In this stage, the initialization operation is not performed.

Next, the bit line pair BL, /BL connected to the memory cell MC subjected to the write operation or read operation are selected by the column decoder 15. Then, the control circuit 22 selects the word line FWL by using a row address signal RAC. Thus, data of the flag cell FC connected to the selected bit line is read by means of the read circuit 18. At this time, since the switching signal DPOL is high, the data of the flag cell FC is read as "1" data.

The control circuit 22 confirms data read from the flag cell FC. The rewrite operation of inverted data is performed if the data is "1" data and the rewrite operation of inverted data is not performed if the data is "0" data. In this embodiment, since data items of all of the flag cells FC are read as "1" data, the rewrite operation is performed for a column (bit line) corresponding to the flag cell FC when each flag cell FC is first accessed.

That is, the control circuit 22 sequentially selects the memory cells MC in the selected column by supplying a row address signal RAC to the row decoder 14. Then, the read circuit 18 reads data from the selected memory cell MC. The read data is transmitted to and latched in the latch circuit 23.

Subsequently, the read data latched in the latch circuit 23 is supplied to the write circuits 16 and 17. Next, the control circuit 22 sequentially selects the memory cells MC in the selected column. Then, the write circuits 16 and 17 sequentially write inverted data items obtained by inverting the read data items to the selected memory cells MC.

In the rewrite operation, data of the flag cell FC is also inverted (replaced by "0" data). Thus, when the switching signal DPOL goes low, data of the flag cell FC is read as "1" data. Therefore, when each flag cell FC is first accessed, the rewrite operation is performed for a column (bit line) corresponding to the flag cell FC.

After data items of one column of the memory cell array 11 are inverted, the write circuits 16 and 17 perform the data write operation for the above column based on the switching signal DPOL. Likewise, the read circuit 18 performs the data read operation based on the switching signal DPOL.

As described above, according to the third embodiment, like the first embodiment, the service life of the memory cell MC can be elongated by suppressing an influence of an unbalanced application environment when this embodiment is applied to the all-night operation type (continuous operation type) system.

Fourth Embodiment

Figure 12:
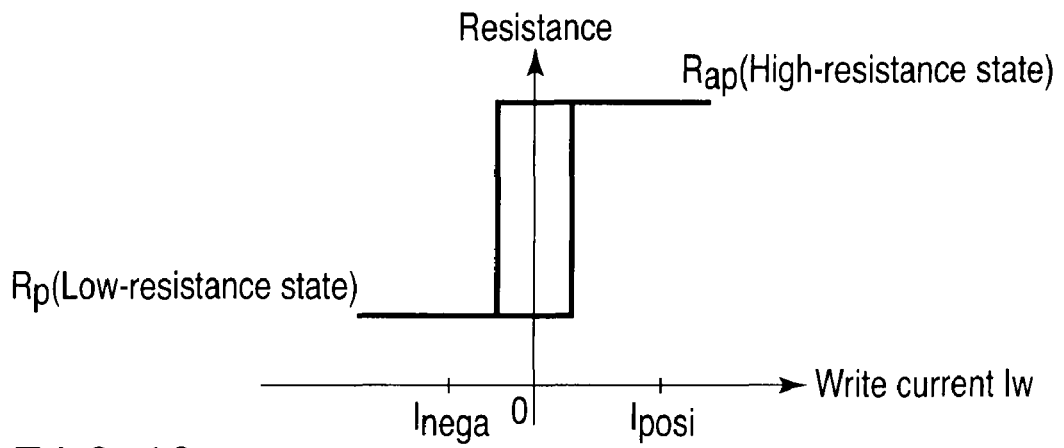
FIG. 12 is a diagram showing an ideal I-R curve of a magnetoresistive element 30.

In a magnetoresistive element 30, the direction of magnetization of a recording layer 35 is reversed by supplying a bidirectional write current Iw thereto. Data is identified according to a resistance variation of the magnetoresistive element 30 that varies based on the magnetization arrangement of the fixed layer 33 and recording layer 35. FIG. 12 is a diagram showing an ideal I-R curve of the magnetoresistive element 30. The abscissa indicates a write current Iw and the ordinate indicates the resistance of the magnetoresistive element 30. Rap indicates the resistance of the magnetoresistive element 30 in which the magnetization of the fixed layer 33 and recording layer 35 is set in an anti-parallel state (high-resistance state) and Rp indicates the resistance of the magnetoresistive element 30 in which the magnetization of the fixed layer 33 and recording layer 35 is set in a parallel state (low-resistance state). Further, Inega indicates the maximum value of a negative write current Iw and Iposi indicates the maximum value of a positive write current Iw. The absolute value of the maximum value Iposi is larger than that of the maximum value Inega.

Figure 13:
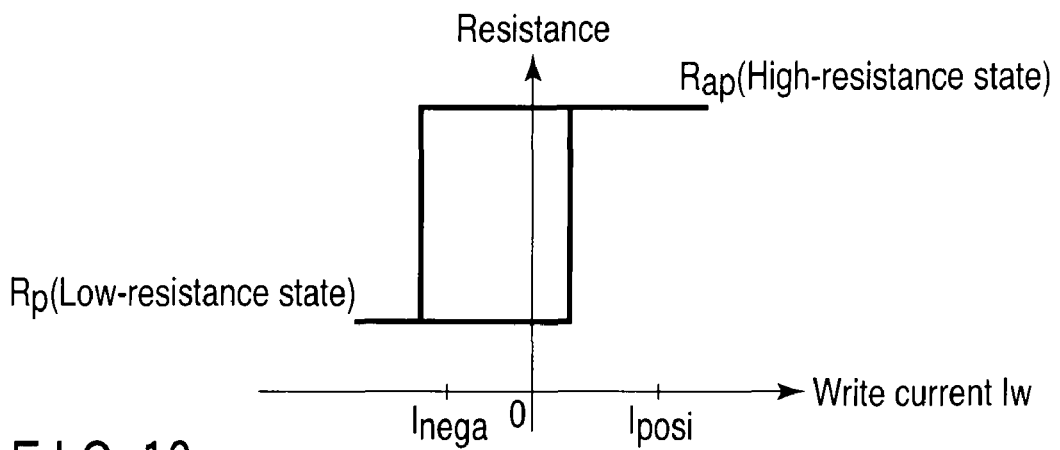
FIG. 13 is a diagram showing an I-R curve of the magnetoresistive element 30 in which positive and negative inversion currents are unsymmetrical.

It is ideal that the I-R curve of the magnetoresistive element 30 becomes an I-R hysteresis loop having inverted current threshold values that are symmetrical with respect to the Y axis as shown in FIG. 12. However, in practice, as shown in FIG. 13, the magnetic characteristic is shifted due to the film thickness distribution and defects of the magnetoresistive element 30 and the inverted current becomes substantially unsymmetrical on the positive and negative sides in some cases. Further, when a memory cell MC formed of the magnetoresistive element 30 and select transistor 31 that are serially connected is considered, the apparent conductance of a nonlinear element varies according to whether the potential on the source side is set into an electrically floating state or not since the select transistor 31 formed of MOSFETs is a nonlinear element. As a result, the maximum value of the write current Iw varies according to the polarity of voltage applied to the memory cell MC.

Figure 14:
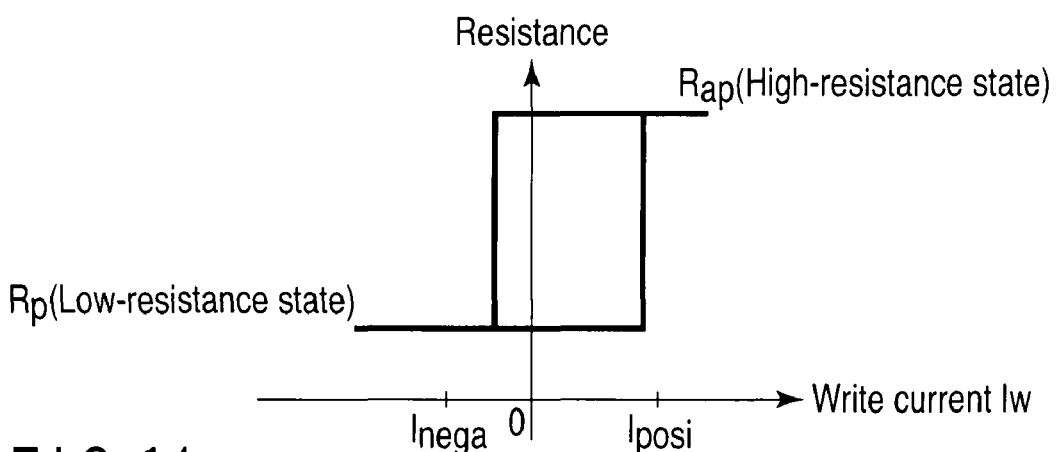
FIG. 14 is a diagram showing an I-R curve obtained after trimming in the magnetoresistive element 30 having the I-R curve shown in FIG. 13.

When the hysteresis loop is shifted with respect to the Y axis as shown in FIG. 13, the direction of a current that is passed through the memory cell MC is reversed in the unit of bit lines, word lines, a preset number of memory cells MC or the memory cell array 11. FIG. 14 is a diagram showing an I-R curve obtained when the write current flowing in the magnetoresistive element 30 having the I-R curve shown in FIG. 13 is inverted (that is, after the trimming operation).

As shown in FIG. 14, it is possible for the magnetoresistive element 30 to have a large operation margin by changing the direction of the write current Iw. As a determination criterion to determine the direction in which the write current Iw flows, for example, data indicating the direction in which the current is caused to flow at the write time is stored in the flag cell FC and the direction of the current is determined based on the data of the flag cell FC.

Figure 15:
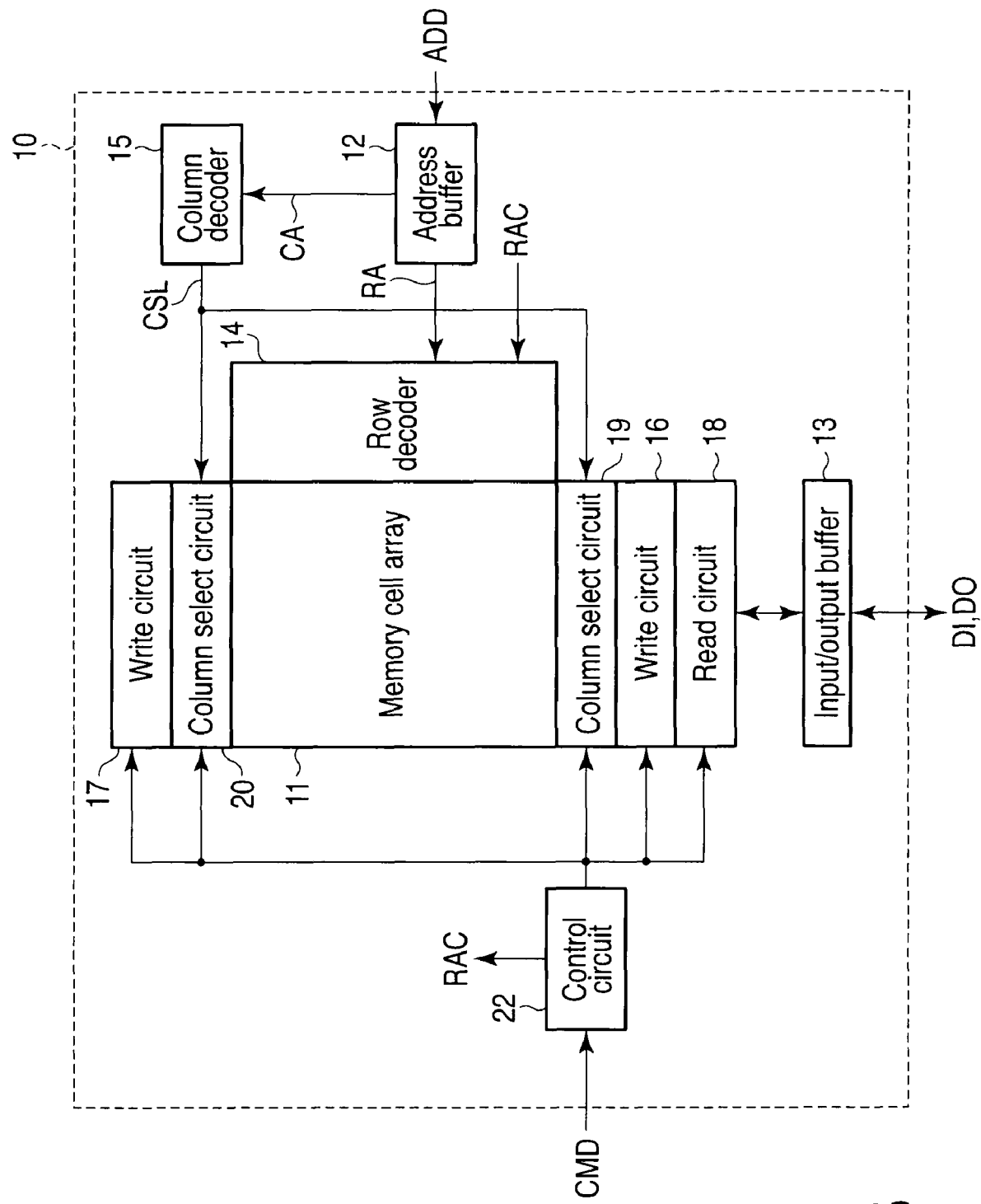
FIG. 15 is a block diagram showing the configuration of a semiconductor memory device 10 according to a fourth embodiment of this invention.

FIG. 15 is a block diagram showing the configuration of a semiconductor memory device 10 according to the fourth embodiment of this invention. The semiconductor memory device 10 has a memory cell array 11, address buffer 12, input/output buffer 13, row decoder 14, column decoder 15, write circuits 16 and 17, read circuit 18, column select circuits 19 and 20 and control circuit 22.

The configuration of the memory cell array 11 is the same as that of FIG. 6. The memory cell array 11 has a flag cell column 37 in addition to m×n memory cells MC arranged in a matrix form. The flag cell column 37 is configured by n flag cells FC arranged in the row direction. That is, in the present embodiment, a case wherein allocations of "0" and "1" data items are switched in the bit line unit (column unit) is explained. However, this invention is not limited to this case and allocations of "0" and "1" data items may be switched in the word line unit (row unit), in the block unit formed of a preset number of memory cells MC or in the unit of the whole portion of the memory cell array 11.

In each of the flag cells FC, "0" data or "1" data is stored according to the polarity of the write current Iw. For example, if data of the flag cell FC is "0", the write circuits 16 and 17 supply a write current Iw to the magnetoresistive element 30 to set the low-resistance state to "0" data and set the high-resistance state to "1" data. On the other hand, if data of the flag cell FC is "1", the write circuits 16 and 17 supply a write current Iw to the magnetoresistive element 30 to impart an inverted allocation, that is, set the low-resistance state to "1" data and set the high-resistance state to "0" data.

The read circuit 18 switches allocations of the low-resistance state and high-resistance state of the magnetoresistive element 30 and "0" and "1" data items according to data of the flag cell FC. That is, the read circuit 18 outputs read data to set the low-resistance state to "0" data and set the high-resistance state to "1" data when data of the flag cell FC is "0". Further, the read circuit 18 outputs read data to impart an inverted allocation, that is, set the low-resistance state to "1" data and set the high-resistance state to "0" data when data of the flag cell FC is "1".

The operation of the semiconductor memory device 10 thus configured is explained. It is supposed that the characteristics of the memory cells are previously measured before the product shipment time and "1" data or "0" data is written to the flag cell FC to impart an allocation so as to make an operation margin of the magnetoresistive element 30 large based on the measurement result.

First, the data write operation is explained below. When the control circuit 22 receives a write command and the address buffer 12 receives an address signal ADD, the semiconductor memory device 10 starts the data write operation. At the start, the column decoder 15 selects a bit line pair BL, /BL connected to the memory cell MC subjected to the write operation. Then, the control circuit 22 selects a word line FWL by using a row address signal RAC. As a result, data of the flag cell FC connected to the selected bit line is read by means of the read circuit 18. The data of the flag cell FC is supplied to the write circuits 16 and 17.

Subsequently, the word line WL connected to the memory cell MC subjected to the write operation is selected by means of the row decoder 14. Then, the write circuits 16 and 17 determine an allocation based on data of the flag cell FC and supplies a write current Iw corresponding to the write data to the selected bit line pair BL, /BL based on the allocation. Thus, desired data is written to the memory cell MC subjected to the write operation.

Next, the data read operation is explained. When the control circuit 22 receives a read command and the address buffer 12 receives an address signal ADD, the semiconductor memory device 10 starts the data read operation. First, the column decoder 15 selects a bit line pair BL, /BL connected to the memory cell MC subjected to the read operation. Then, the control circuit 22 selects a word line FWL by using a row address signal RAC. As a result, data of the flag cell FC connected to the selected bit line is read by means of the read circuit 18.

Subsequently, the word line WL connected to the memory cell MC subjected to the read operation is selected by means of the row decoder 14. Then, the read circuit 18 determines an allocation based on data of the flag cell FC and outputs read data based on the allocation. Thus, desired data is read from the memory cell MC subjected to the read operation.

As described above, according to the fourth embodiment, the allocations of the low-resistance state and high-resistance state of the magnetoresistive element 30 and "0" and "1" data items can be switched by taking the characteristics of the memory cells MC into consideration. Thus, it becomes possible for the memory cell MC to have a large operation margin. As a result, the number of chips that can be relieved by performing a trimming operation is increased and the manufacturing yield of the chips can be enhanced, and therefore, the manufacturing cost can be lowered.

Fifth Embodiment

In the fifth embodiment, a semiconductor memory device 10 has a plurality of memory cell arrays 11 and measuring circuits 40 having measurement memory cells (memory cells of measurement object) each of which has the same configuration as the memory cell MC are arranged near the respective memory cell arrays 11. Then, the characteristics of the measurement memory cells are measured and the measurement result is reflected on the trimming operation to perform an optimum trimming operation.

FIG. 16 is a schematic diagram showing the configuration of the semiconductor memory device 10 according to the fifth embodiment of this invention. The semiconductor memory device 10 has a plurality of memory cell arrays 11 (in this embodiment, twelve memory cell arrays 11-1 to 11-12 are shown as one example). The configuration of each memory cell array 11 is the same as that of FIG. 6. Further, the peripheral circuit of the memory cell array 11 is the same as that of FIG. 15.

The semiconductor memory device 10 has a plurality of measuring circuits 40 used to acquire trimming data. In this embodiment, eleven measuring circuits 40 are shown in FIG. 16 as one example. The plurality of measuring circuits 40 are uniformly arranged between and around the plurality of memory cell arrays 11.

Each measuring circuit 40 has a plurality of measurement memory cells MC each which is measuring object and has the same configuration as the memory cell MC of the memory cell array 11. For example, in the case of a 1-Gbit chip (semiconductor memory device 10), one memory cell array 11 has approximately several ten Mbits to several hundred Mbits and one measuring circuit 40 is formed as a small-scale circuit having several ten bits to several kbits. The measuring circuit 40 is a simple circuit having a column decoder, row decoder and electrode pads in addition to a small-scale memory cell array.

The characteristics of bits that cannot be evaluated by use of a normal memory cell array 11 can be acquired by means of the measuring circuit 40 and the whole portion of the chip can be subjected to the optimum trimming operation explained in the fourth embodiment. The measuring circuit 40 can be mounted at least one on each chip, and if it is desired to acquire more specific characteristics of the memory cells MC, a plurality of measuring circuits can be arranged in the chip as shown in FIG. 16.

FIG. 17 is an equivalent circuit diagram showing the configuration of one measuring circuit 40 shown in FIG. 16. The measuring circuit 40 has a memory cell array 41. The memory cell array 41 has 16 (4×4) measurement memory cells MC, for example. The configuration of each measurement memory cell MC shown in FIG. 17 is the same as that of the memory cell MC of the memory cell array 11.

Four bit lines BL1 to BL4 extending in the column direction are arranged in the memory cell array 41. Further, four bit lines /BL1 to /BL4 extending in the column direction are arranged in the memory cell array 41. In addition, four word lines WL1 to WL4 extending in the row direction are arranged in the memory cell array 41. The connection relation between the bit line pairs BL, /BL and word lines WL and the memory cells MC is the same as that of FIG. 6.

The characteristics of the 16-bit memory cells MC are acquired by means of the memory cell array 41. For this purpose, for example, terminals (not shown) are connected to the bit line pairs BL, /BL and word lines WL. The characteristic of the memory cell array 41 is measured by bring a measurement probe into contact with the terminal and supplying a write current to each memory cell MC. Then, the semiconductor memory device 10 performs the same trimming operation as that of the fourth embodiment by setting data of the flag cell FC based on the measurement result.

FIG. 18 is a block diagram showing another configuration example of the measuring circuit 40. The measuring circuit 40 has a row decoder 42, column decoder 43, write circuits 44 and 45, read circuit 46 and column select circuits 47 and 48 in addition to a memory cell array 41. That is, like the case of FIG. 1 or the like, the measuring circuit 40 has a peripheral circuit that performs the data write and read operations.

A measurement probe is selectively brought into contact with one of terminals (not shown) respectively connected to the row decoder 42 and column decoder 43 to directly supply an address signal ADD to the decoders. The row decoder 42 selects one of the word lines WL1 to WL4 according to the address signal ADD. The column decoder 43 decodes the address signal ADD to acquire column select signals CSL1 to CSL4. The column select signals CSL1 to CSL4 are supplied to the column select circuits 47 and 48.

The bit lines BL1 to BL4 are connected to the write circuit 44 and read circuit 46 via the column select circuit 47. The column select circuit 47 connects a selected bit line BL to the write circuit 44 (or write circuit 46) according to the column select signal CSL.

The bit lines /BL1 to /BL4 are connected to the write circuit 45 via the column select circuit 48. The column select circuit 48 connects a selected bit line /BL to the write circuit 45 according to the column select signal CSL.

The write circuits 44 and 45 write data to a selected memory cell MC. Specifically, the write circuits 44 and 45 supply a write current of a direction corresponding to data to the selected bit line pair BL, /BL.

The read circuit 46 reads data from a selected memory cell MC. Specifically, the read circuit 46 reads data from the selected memory cell MC by detecting currents (or voltage) of the selected bit line pair BL. The read data is output to the exterior from a terminal (not shown) connected to the read circuit 46.

With the configuration of FIG. 18, the characteristic of the memory cell array 11 can be measured by inputting an address signal ADD.

As described above, according to the fifth embodiment, the characteristic of the memory cell array 11 can be measured by using the measuring circuit 40 arranged near the memory cell array 11 in a case where specification of the memory cell MC is different depending on a position in which the memory cell array 11 is arranged. As a result, setting of an optimum trimming operation can be made by using the measurement result.

Further, the number of chips that can be relieved by performing a trimming operation is increased and the manufacturing yield of the chips can be enhanced, and therefore, the manufacturing cost can be lowered.

Sixth Embodiment

In the first to fifth embodiments, a case wherein the magnetoresistive element is used as one example of the memory element 30 contained in the memory cell MC is explained. However, this invention is not limited to the above case and various types of nonvolatile memories can be used. Other examples of the memory element 30 are explained below.

[1. Resistance-Change Type Nonvolatile Memory (ReRAM: Resistance RAM)]

Figure 19:
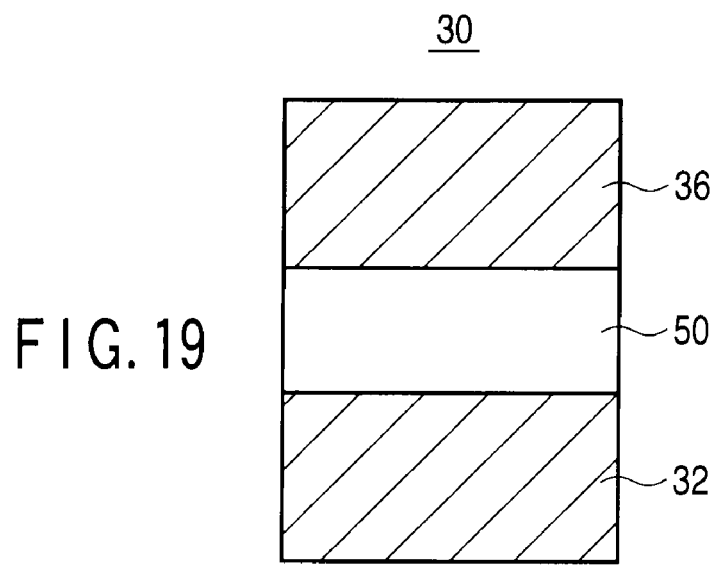
FIG. 19 is a cross-sectional view showing the structure of a resistance-change element 30.

An ReRAM can be used as the semiconductor memory device 10. In this case, as the memory element 30, a resistance-change element is used. FIG. 19 is a cross-sectional view showing the structure of the resistance-change element 30.

The resistance-change element 30 has a lower electrode 32, upper electrode 36 and a recording layer (resistance-change layer) 50 disposed therebetween. As the recording layer 50, a perovskite oxide film or binary-series transition metal oxide film is used. As the perovskite oxide film, $Pr_{0.7}Ca_{0.3}MnO_3$, $SrZrO_3/SrTiO_3$ or $Pb(Zr, Ti)O_3/Zn_{0.4}Cd_{0.6}S$ may be provided. As the binary transition metal oxide film, NiO, TiN, $TiO_2$, $HfO_2$ or $ZrO_2$ may be provided.

The resistance of the recording layer 50 is changed by application of a voltage pulse. The recording layer 50 has a high-resistance state (reset state) and low-resistance state (set state) and is selectively transited to one of the above states by application of a voltage pulse.

That is, assume that voltage that causes the recording layer 50 to be transited from the high-resistance state (reset state) to the low-resistance state (set state) is set as set voltage Vset and voltage that causes the recording layer 50 to be transited from the low-resistance state (set state) to the high-resistance state (reset state) is set as reset voltage Vreset. Then, the set voltage Vset is set to a positive bias that causes plus voltage to be applied to the upper electrode 36 with respect to the lower electrode 32 and the reset voltage Vreset is set to a negative bias that causes minus voltage to be applied to the upper electrode 36 with respect to the lower electrode 32. As a result, the resistance-change element 30 can store 1-bit data by respectively setting the low-resistance state and high-resistance state in correspondence to "0" and "1" data items.

In the data read operation, sufficiently low voltage that is set to approximately 1/1000 to 1/4 times the reset voltage Vreset is supplied to the resistance-change element 30. Then, data can be read by detecting a variation in the current at this time.

[2. Phase-Change Type Nonvolatile Memory (PRAM: Phase-Change RAM)]

A PRAM can be used as the semiconductor memory device 10. In this case, as the memory element 30, a phase-change element is used. The cross section of the phase-change element 30 is the same as that of FIG. 19.

The phase-change element 30 has a lower electrode 32, upper electrode 36 and a recording layer (phase-change layer) 50 disposed therebetween. The recording layer 50 is phase-changed from a crystalline state to an amorphous state or from an amorphous state to a crystalline state due to heat generated by passing a current from the upper electrode 36 to the lower electrode 32. The resistance of the recoding layer 50 becomes low (low-resistance state) in the crystalline state and becomes high (high-resistance state) in the amorphous state.

As a material of the recording layer 50, a chalcogen compound such as Ge—Sb—Te, In—Sb—Te, Ag—In—Sb—Te or Ge—Sn—Te can be given. The above materials can be preferably used to attain the high-speed switching operation, repeated recording stability and high reliability.

Figure 20:
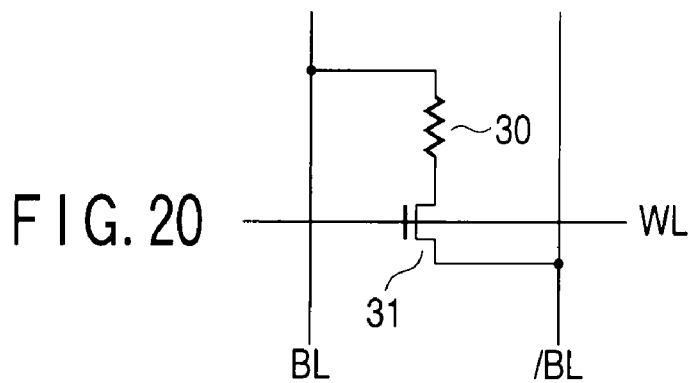
FIG. 20 is a circuit diagram showing the configuration of a memory cell MC using a phase-change element.

FIG. 20 is a circuit diagram showing the configuration of the memory cell MC using the phase-change element. One end of the phase-change element 30 is connected to the bit line BL. The other end of the phase-change element 30 is connected to the drain of the select transistor 31. The source of the select transistor 31 is connected to the bit line /BL. The gate of the select transistor 31 is connected to the word line WL.

Next, the operation of writing data to the memory cell MC configured by the phase-change element 30 and select transistor 31 is explained. First, a pulse-like current is applied to the recording layer 50. The recording layer 50 is heated by application of the current pulse. The current value of the current pulse is set to set the temperature of the recording layer 50 equal to or higher than a crystallization temperature threshold value TH. The crystallization temperature threshold value TH is a temperature at which the recording layer is changed from the crystalline state to the amorphous state. The temperature of the recording layer 50 heated by application of the current pulse is rapidly lowered after application of the current pulse. At this time, the recording layer 50 is set into the amorphous state (high-resistance state).

A small current whose current value is reduced is applied to the recording layer 50 after the pulse-like current. In this case, the temperature of the recording layer 50 heated by application of the current pulse is lowered, but the temperature is slowly lowered by application of a small current. At this time, the recording layer 50 is set into the crystalline state (low-resistance state).

That is, the recording layer 50 heated by application of the current is heated to a temperature equal to or higher than the crystallization temperature threshold value TH. Thus, the recording layer 50 is set into the crystalline state (low-resistance state) when a temperature drop near the crystallization temperature threshold value TH is small and maintains the amorphous state (high-resistance state) when a temperature drop near the crystallization temperature threshold value TH is large depending on the condition of a fall of the applied current pulse.

Then, 1-bit information can be written to the memory cell MC by defining the case wherein the recording layer 50 is set in the amorphous state (high-resistance state) as "1" data and defining the case wherein it is set in the crystalline state (low-resistance state) as "0" data. The data read operation is the same as that of the case of the magnetoresistive element.

[3. Ferroelectric Memory (FeRAM: Ferroelectric RAM)]

As the semiconductor memory device 10, an FeRAM can be used. In this case, the memory cell MC is configured by a ferroelectric capacitor 30 and select transistor 31. That is, the ferroelectric capacitor 30 corresponds to the memory element. The cross section of the ferroelectric capacitor 30 is the same as that of FIG. 19.

The ferroelectric capacitor 30 has a lower electrode 32, upper electrode 36 and a ferroelectric film 50 disposed therebetween. As the ferroelectric film 50, PZT [$Pb(Zr_xT_{1-x})O_3$], SBT ($SrBi_2Ta_2O_9$) or the like is used.

The ferroelectric substance is a dielectric substance that can change the direction of spontaneous polarization by applying voltage thereto and maintain the direction of the polarization even after the voltage application is interrupted. The ferroelectric capacitor 30 can be used as a memory element by setting two polarized states of the ferroelectric capacitor 30 in correspondence to "0" and "1" data items.

Figure 21:
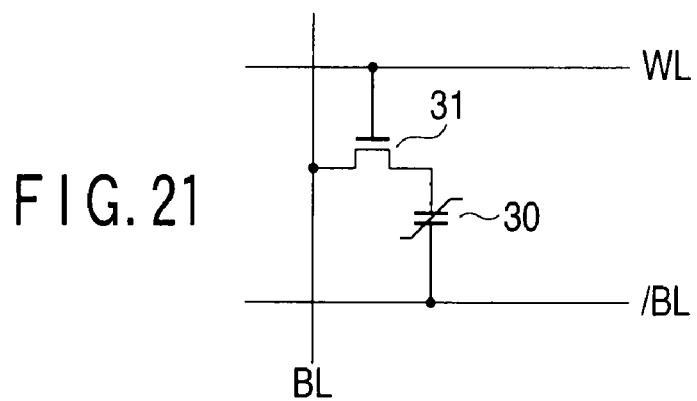
FIG. 21 is a circuit diagram showing the configuration of a memory cell MC using a ferroelectric capacitor.

FIG. 21 is a circuit diagram showing the configuration of the memory cell MC using the ferroelectric capacitor. The drain of the select transistor 31 is connected to the bit line BL. The gate of the select transistor 31 is connected to the word line WL. The source of the select transistor 31 is connected to one electrode of the ferroelectric capacitor 30. The other electrode of the ferroelectric capacitor 30 is connected to the bit line /BL.

The same effect as that of the first to fifth embodiments can be attained when the above memory elements 30 are used.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
   a memory cell array having a plurality of memory cells which are set into low-resistance states/high-resistance states according to "0" data/"1" data;
   a timer circuit configured to generate a pulse at each preset time,
   a plurality of flag cells provided for a plurality of memory cell strings each of which comprises a preset number of memory cells among the plurality of memory cells; and
   a write circuit,
   wherein an allocation of the "0" data/"1" data and the low-resistance state/high-resistance state is switched each time the pulse is generated,
   the flag cells are configured to store allocation information of the "0" data/"1" data and the low-resistance state/high-resistance state, and
   the write circuit is configured to rewrite data of a memory cell string to inverted data obtained by inverting the data of the memory cell string based on the allocation information stored in the flag cells when the memory cell string is first accessed after the allocation is switched.

2. The device according to claim 1, further comprising a read circuit configured to read data from the memory cell array according to the allocation.

3. The device according to claim 1, further comprising a setting circuit configured to generate a signal used to switch the allocation based on the pulse.

4. The device according to claim 1, wherein the write circuit is configured to invert data of a flag cell corresponding to a memory cell string, data of which is inverted.

5. The device according to claim 1, the flag cell has the same configuration as the memory cell.

6. The device according to claim 1, wherein the memory cells are configured by one of MRAM, ReRAM, PRAM and FeRAM cells.

* * * * *